United States Patent
Ishibashi et al.

(10) Patent No.: US 8,727,792 B2
(45) Date of Patent: May 20, 2014

(54) SEMICONDUCTIOR DEVICE SOCKET INCLUDING CONTACT BLOCK

(75) Inventors: Takahiro Ishibashi, Tokyo (JP); Katunori Takahashi, Tokyo (JP); Noriyuki Matsuoka, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 98 days.

(21) Appl. No.: 13/513,123

(22) PCT Filed: Oct. 8, 2010

(86) PCT No.: PCT/JP2010/006042
§ 371 (c)(1),
(2), (4) Date: May 31, 2012

(87) PCT Pub. No.: WO2011/067884
PCT Pub. Date: Jun. 9, 2011

(65) Prior Publication Data
US 2012/0233853 A1    Sep. 20, 2012

(30) Foreign Application Priority Data

Dec. 1, 2009 (JP) .................... 2009-273696

(51) Int. Cl.
*H01R 12/00* (2006.01)
(52) U.S. Cl.
USPC .......................................................... 439/71
(58) Field of Classification Search
USPC ................................................... 439/71–73
See application file for complete search history.

(56) References Cited

U.S. PATENT DOCUMENTS

| | | | | |
|---|---|---|---|---|
| 6,439,897 B1 | * | 8/2002 | Ikeya | 439/73 |
| 7,335,030 B2 | * | 2/2008 | Kunioka et al. | 439/73 |
| 7,563,144 B2 | * | 7/2009 | Kunioka et al. | 439/700 |
| 2007/0072479 A1 | | 3/2007 | Osato et al. | |

FOREIGN PATENT DOCUMENTS

| | | |
|---|---|---|
| CN | 1722545(A) | 1/2006 |
| CN | 1905289(A) | 1/2007 |
| JP | 11-2656 | 1/1999 |
| JP | 2003-115361 | 4/2003 |
| JP | 2004-14470 | 1/2004 |
| WO | WO 2006/003722 | 1/2006 |

OTHER PUBLICATIONS

English-language International Preliminary Report on Patentability issued by The International Bureau of WIPO in International Application No. PCT/JP2010/006042, dated Jun. 5, 2012 (5 pages).
English-language Written Opinion of the International Searching Authority issued by The International Bureau of WIPO in International Application No. PCT/JP2010/006042, mailed Nov. 16, 2010 (6 pages).
English-language International Search Report from the European Patent Office mailed Nov. 16, 2010, for International Application No. PCT/JP2010/006042.

* cited by examiner

*Primary Examiner* — Xuong Chung Trans
(74) *Attorney, Agent, or Firm* — Finnegan, Henderson, Farabow, Garrett & Dunner, LLP

(57) ABSTRACT

In a contact block comprising a contact holder having multiple through-holes arranged in a position adjustment direction, two positioning pins are inserted via the through-holes to two through-holes selected from multiple through-holes formed in a contact block accommodation portion in the position adjustment direction, and thereby the relative positions of contact portions of contact terminals held by the contact holder can be adjusted with respect to terminals of a semiconductor device.

1 Claim, 37 Drawing Sheets

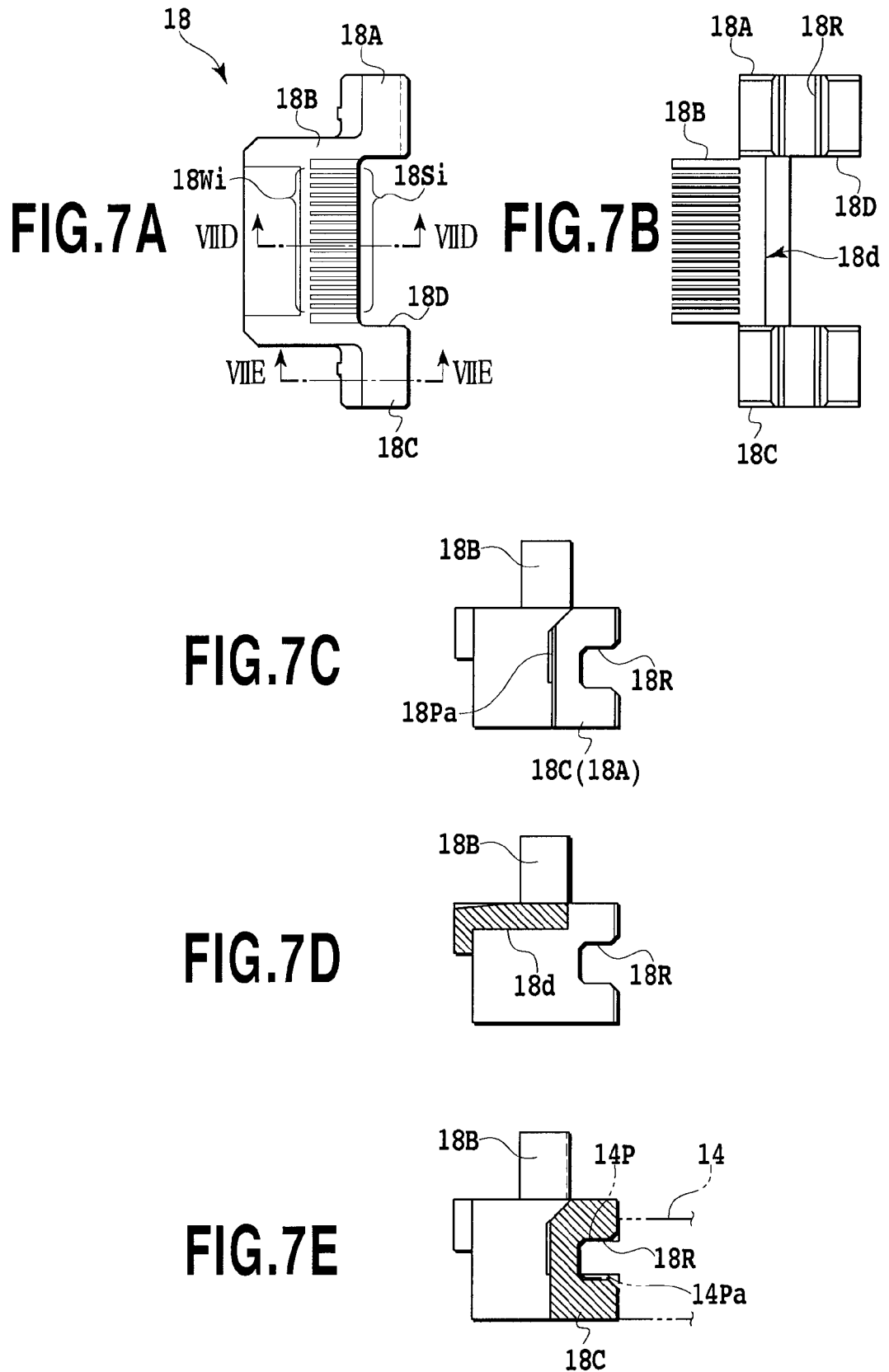

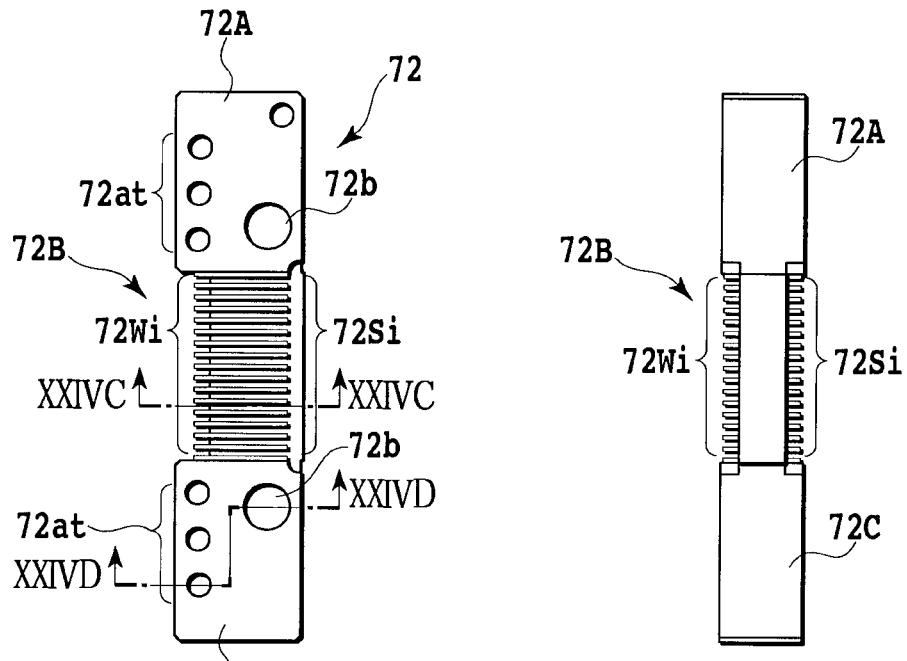
FIG.24A
FIG.24B
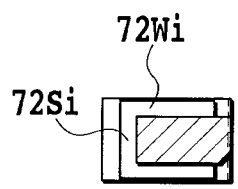
FIG.24C
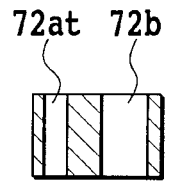
FIG.24D

SEMICONDUCTIOR DEVICE SOCKET INCLUDING CONTACT BLOCK

TECHNICAL FIELD

The present invention relates to a semiconductor device socket including a contact block.

BACKGROUND ART

A semiconductor device socket is generally referred to as an IC (integrated circuit) socket. As disclosed in PATENT DOCUMENT 1, for example, a semiconductor device socket is disposed on a printed wiring board provided with an input-output unit configured to receive supply of a given test voltage and send an abnormal detection signal representing a short circuit or the like from a semiconductor device as an object to be inspected. Such a semiconductor device socket comprises a group of contact terminals (contacts) having contact points which come into contact with respective terminals (electrodes) of a semiconductor device. A contact block attachable to or detachable from a socket body of the semiconductor device socket has been proposed as shown in PATENT DOCUMENT 1 in order to facilitate replacement of the group of contact terminals.

In PATENT DOCUMENT 1, a contact block includes multiple pairs of contact pieces and a combining block for combining the contact pieces. The contact block is fixed to the socket body by a fixing bolt screwed into a female screw hole in the connection block through a hole in a plate-like member of the socket body. Then, a burn-in test of a semiconductor device is executed with electrodes of the semiconductor device pressed against contact points of the respective contact pieces.

CITATION LIST

Patent Literature

Patent Document 1:
  domestic re-publication of WO2006/003722 in Japan

SUMMARY OF INVENTION

In semiconductor devices, positions of electrodes (dimensions of terminals) may vary within a predetermined tolerance owing to manufacturing variations. On the other hand, a semiconductor device socket might be required in some cases to leave marks at predetermined positions of the electrodes (the terminals) of the semiconductor device by the contact points of the contact terminals.

For example, the marks left on the electrodes (the terminals) of the semiconductor device by the contact points of the contact terminals may be deviated from the predetermined positions due to variations in the terminal dimensions of the semiconductor device. In this case, the semiconductor devices may be determined as defective items in the appearance inspection of the semiconductor device, and the yield thereof may be significantly dropped. A conceivable method to avoid such a situation is to adjust the positions of the terminals of the semiconductor device and the contact points of the contact terminals in advance.

However, the above-described contact block has a configuration which is fixed to a prescribed position of the socket body and therefore is not adjustable in position with respect to the semiconductor device. In this configuration, it is difficult to adjust the positions of the terminals of the semiconductor device with respect to the contact points of the contact terminals in advance.

In view of the above-described problem, the present invention aims to provide a semiconductor device socket including a contact block. The semiconductor device socket can adjust the relative position of a contact terminal of the contact block with respect to a terminal of a semiconductor device.

To achieve the object, a semiconductor socket according to the present invention comprises: at least one contact block detachably provided in a contact block accommodation portion formed around a semiconductor device accommodation portion to locate a semiconductor device, the contact block including a plurality of thin-plate contact terminals each having a contact portion to be electrically connected to a terminal of the semiconductor device; and position adjusting means for adjusting relative positions of the contact portions of the plurality of contact terminals held by the at least one contact block with respect to the terminals of the semiconductor device located at the semiconductor device accommodation portion.

The semiconductor socket according to the present invention may include: first and second contact blocks detachably provided on at least one contact block accommodation portion formed around a semiconductor device accommodation portion to locate a semiconductor device, each of the first and second contact blocks including a plurality of thin-plate contact terminals each having a contact portion to be electrically connected to a terminal of the semiconductor device; and position adjusting means for adjusting relative positions of the contact portions of the plurality of contact terminals held by each of the first and second contact blocks with respect to the terminals of the semiconductor device located at the semiconductor device accommodation portion.

The semiconductor device socket according to the present invention includes the position adjusting means for adjusting the relative positions of the contact portions of the multiple contact terminals held by the at least one contact block with respect to the terminals of the semiconductor device located in the semiconductor device accommodation portion. Thus, the semiconductor device socket can adjust the relative positions of the contact terminals in the contact block with respect to the terminals of the semiconductor device.

BRIEF DESCRIPTION OF DRAWINGS

FIG. 7A is a plan view illustrating a side stopper member constituting part of the contact block shown in FIG. 2;

FIG. 7B is a front view of the view shown in FIG. 7A;

FIG. 7C is a side view of the view shown in FIG. 7A;

FIG. 7D is a cross-sectional view taken along the VIID-VIID line in the view shown in FIG. 7A;

FIG. 7E is a cross-sectional view taken along the VIIE-VIIE line in the view shown in FIG. 7A;

FIG. 24A is a plan view illustrating a contact holder constituting part of the contact block shown in FIG. 20;

FIG. 24B is a side view of the view shown in FIG. 24A;

FIG. 24C is a cross-sectional view taken along the XXIVC-XXIVC line shown in FIG. 24A;

FIG. 24D is a cross-sectional view taken along the XXIVD-XXIVD line shown in FIG. 24A;

DESCRIPTION OF EMBODIMENTS

Figure 2:
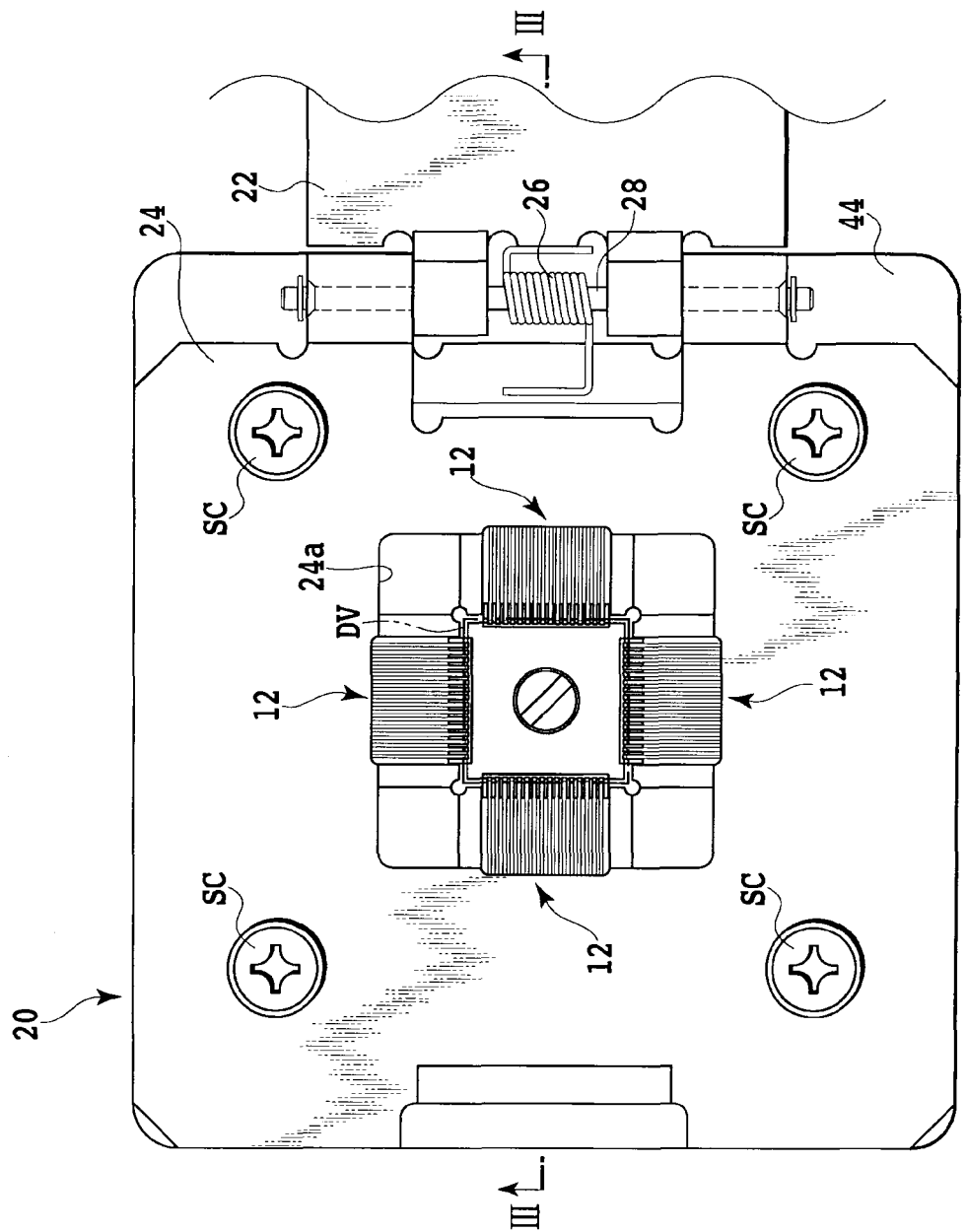
FIG. 2 is a plan view showing a pressing mechanism in the first embodiment of the semiconductor device socket according to the present invention.
Figure 3:
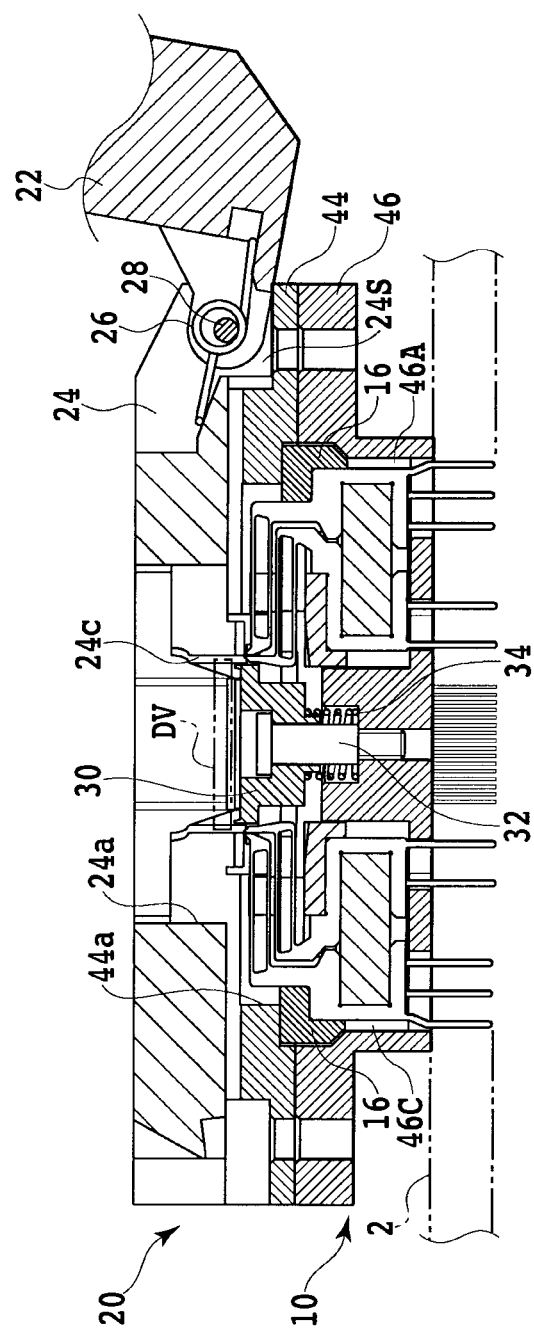
FIG. 3 is a cross-sectional view taken along the line in the example shown in FIG. 2.

FIG. 2 and FIG. 3 show appearance of a first embodiment of a semiconductor device socket according to the present invention. For example, multiple semiconductor device sockets are arranged in positions corresponding to respective given conductive layers on a printed wiring board 2. Here, a single semiconductor device socket is representatively shown in FIG. 2 and FIG. 3.

As for a package type, a semiconductor device DV is a QFP type of semiconductor device, for example, having a substantially square shape and having four terminal groups in which multiple terminals are formed at given intervals at each side of the semiconductor device. Note that the package type of the semiconductor device DV is not limited to this example. For example, it is also possible to use a substantially square semiconductor device of a QFJ type, a QFN type, a SOP type, a SON type or the like.

The semiconductor device socket shown in FIG. 2 is adapted to a socket of a so-called clam shell type, for example.

In FIG. 2, the semiconductor device socket includes a pressing mechanism 20 and a socket body 10. The socket body 10 is provided with a contact block housing member 46 and an adapter plate 44.

The pressing mechanism 20 presses the terminal groups of the semiconductor device DV against contact terminals to be described later. The pressing mechanism 20 includes a base member 24 and a lid member 22. The pressing mechanism 20 is configured to be fixed to an upper end surface of the contact block housing member 46, which is disposed on the printed wiring board 2, through the adapter plate 44.

External dimensions of the base member 24 are set substantially equal to external dimensions of the adapter plate 44 and of the contact block housing member 46. An opening 24a is formed at a central part of the base member 24. A semiconductor device accommodation portion 24c is formed inside the opening 24a. The semiconductor device accommodation portion 24c functions as a positioning member for the terminal groups of the semiconductor device DV with respect to the contact terminals to be described later.

A semiconductor device mounting stage 30 to be described later is moved up and down, the mount arranged inside the semiconductor device accommodation portion 24c.

Meanwhile, the opening 24a communicates with an opening 44a of the adapter plate 44 and with an upper end portion of the socket body 10.

Holes for insertion of fixing machine screws SC are respectively provided to four corners around the opening 24a so as to correspond to through-holes in the adapter plate 44 and to female screw holes (not shown) of the contact block housing member 46. Hereby, the base member 24 is fixed to the socket body 10 when the fixing machine screws SC are screwed into the female screw holes of the socket body 10 through the above-mentioned holes of the adapter plate 44. At that time, a lower end portion 24S of the base member 24, which is a portion to be coupled with one end portion of the lid member 22, is placed on an end portion of the adapter plate 44.

The lid member 22 is rotational movably supported by the base member 24 by means of a support shaft 28 at one end thereof. A torsion coil spring 26 configured to bias the other end portion of the lid member 22 in a direction separating from the base member 24 is wound around the support shaft 28. A latch member (not shown) configured to make the lid member 22 held on the base member 24 or make the lid member 22 released therefrom is rotational movably provided on the other end portion of the lid member 22. One end portion of the latch member is rotational movably supported by the lid member 22 while the other end thereof is selectively engaged with a fixing portion of the base member 24.

Although illustration is omitted, a pressing body configured to press an upper surface of the semiconductor device is movably provided inside an opening at a central part on an inner surface side of the lid member 22.

The contact block housing member 46 has the semiconductor device mounting stage 30 located at the central part. The semiconductor device mounting stage 30 has a flat mounting surface to place the semiconductor device DV, and also has a through-hole located at the central part which allows insertion of a flanged support shaft 32 to be fixed to a female screw hole 46d (see FIG. 11). A coil spring 34 is wound around the flanged support shaft 32 in a space between a spring receiving hole 46SR (see FIG. 11) that is formed around the female screw hole 46d and a lower end of the semiconductor device mounting stage 30. Herewith, the semiconductor device mounting stage 30 is supported by the contact block housing member 46 in such a manner as to be moved up and down at a given stroke.

Figure 5:
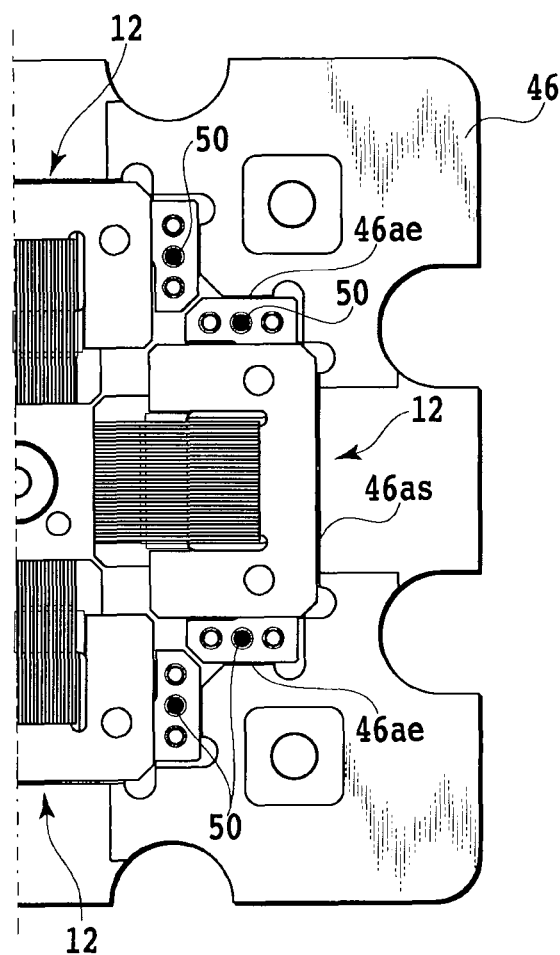
FIG. 5 is a plan view showing a state where the contact blocks are housed in the contact block housing member in the example shown in FIG. 2.
Figure 6:
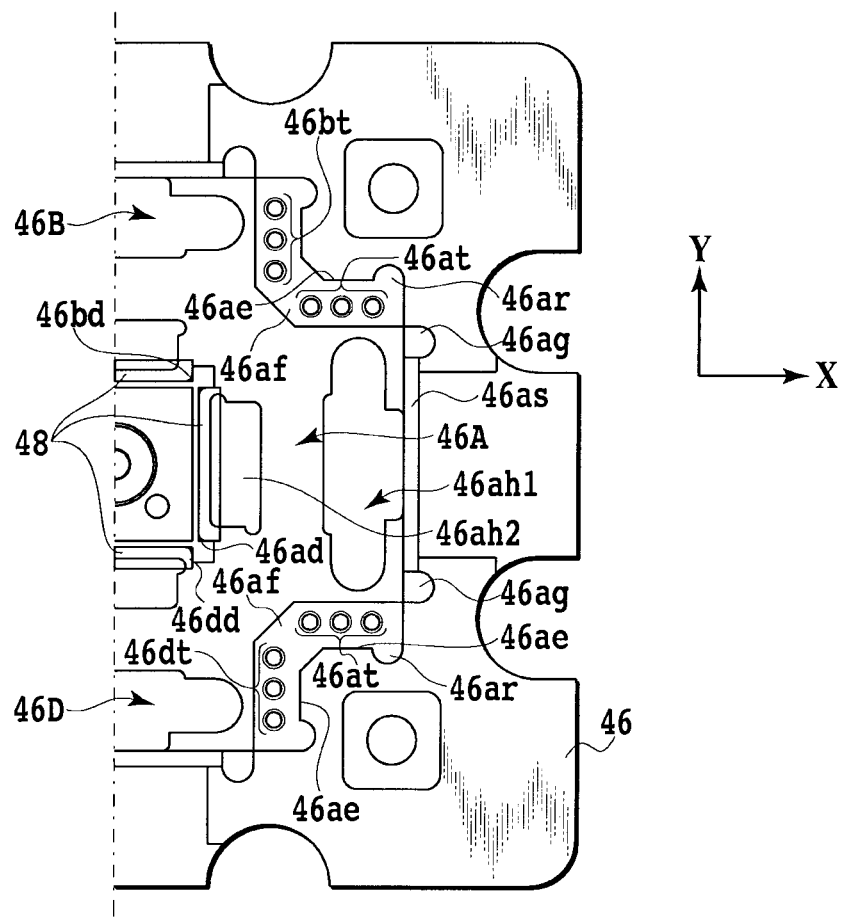
FIG. 6 is a plan view showing a state where the contact blocks in FIG. 5 are detached.

As shown in FIG. 3 and FIG. 6, contact block accommodation portions 46A, 46B, 46C, and 46D are formed substantially in a crisscross shape at 90° intervals peripherally of the semiconductor device mounting stage 30 along a circumferential direction. The contact block accommodation portions 46A, 46B, 46C (see FIGS. 3), and 46D communicate with one another, and respective contact blocks 12 to be described later are detachably housed therein as shown in FIG. 5. Since the contact block accommodation portions 46A, 46B, 46C, and 46D have the same structure, the contract block accommodation portion 46A will be described and explanation on the other contact block accommodation portions 46B to 46D will be omitted.

As shown in FIG. 6, relief portions 46ar are formed to be opposed to each other in inner peripheral surfaces which form the contact block accommodation portion 46A. The relief portions 46ar are formed at portions where the inner peripheral surfaces in a direction intersecting a coordinate axis Y of orthogonal coordinates X and Y shown in FIG. 6 (parallel to a coordinate axis X), i.e., in a direction substantially orthogonal to a direction of arrangement of the contact terminals to be described later, cross the inner peripheral surface along the coordinate axis Y. Each corner portion at an outer peripheral portion of the contact block 12 is inserted into each of the relief portions 46ar. Moreover, two groove portions 46ag are formed at a given interval in the inner peripheral surfaces along the coordinate axis Y between the relief portions 46ar. A recess 46as is formed between the two groove portions 46ag. As shown in FIG. 3, part of an outer peripheral portion of a top stopper member 16 of the contact block 12 to be described later is inserted into the recess 46as.

Positioning surfaces 46ae configured to position the outer peripheral portion of the top stopper member 16 of the contact block 12 are formed in portions the inner peripheral surfaces, along the X coordinate axis in FIG. 6, continuous from the respective relief portions 46ar described above.

Figure 4:
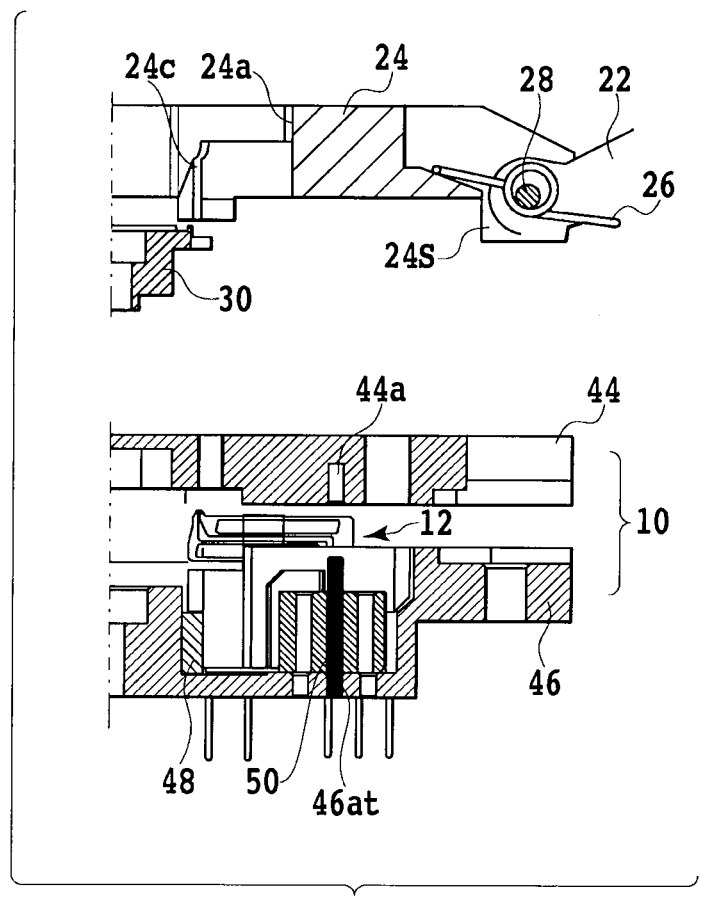
FIG. 4 is a partial cross-sectional view illustrating disassembly of the cross-sectional view shown in FIG. 3.

As shown in FIG. 4 and FIG. 6, a thin-plate elastic member 48 is provided at a recess 46ad, which is formed at a portion facing the recess 46as in the inner peripheral surface that forms the contact block accommodation portion 46A. The elastic member 48 is adapted to bias the attached contact block 12 toward the recess 46as by using its elastic force.

Note that recesses 46*bd* and 46*dd* in the contact block accommodation portions 46B and 46D are similarly provided with elastic members 48. A recess in the unillustrated contact block accommodation portion 46C is also provided with a similar elastic member 48.

As shown in FIG. 6, openings 46*ah*1 and 46*ah*2 are formed at a given interval in a bottom portion that forms the contact block accommodation portion 46A. As shown in FIG. 3, a group of fixation terminals of contact terminals 40*ai*, 40*bi*, 40*ci*, 42*ai*, and 42*bi* of the contact block 12 to be described later respectively penetrate the openings 46*ah*1 and 46*ah*2. The openings 46*ah*1 and 46*ah*2 extend in the direction along the above-mentioned coordinate axis Y. An opening area of the opening 46*ah*1 is set greater than an opening area of the opening 46*ah*2.

Mounting surfaces 46*af* for putting on a lower end portion of a contact holder 14 of the contact block 12 are respectively formed in an inner surface of the bottom portion forming the contact block accommodation portion 46A in positions near both ends of the opening 46*ah*1. One of the mounting surfaces 46*af* is formed in a bent manner so as to border upon the inner peripheral surface forming the contact block accommodation portion 46A and an inner peripheral surface forming the adjacent contact block accommodation portion 46B. The other mounting surface 46*af* is formed in a bent manner so as to border upon the inner peripheral surface forming the contact block accommodation portion 46A and an inner peripheral surface forming the adjacent contact block accommodation portion 46D.

As shown in FIG. 4 and FIG. 6, three through-holes 46*at* constituting part of position adjusting means for the contact block are formed at equal intervals on a common straight line and in a position adjustment direction, i.e., along the coordinate axis X in each of the mounting surfaces 46*af* of the contact block accommodation portion 46A. In the meantime, as shown in FIG. 6, three through-holes 46*bt* or 46*dt* constituting part of position adjusting means for the contact block are formed at equal intervals on a common straight line and in a position adjustment direction, i.e., along the coordinate axis Y in each of the mounting surfaces 46*af* of the contact block accommodation portions 46B and 46D. Positioning pins 50 for positioning the contact blocks with respect to the contact block accommodation portions are selectively inserted into the through-holes 46*at*, the through-holes 46*bt*, and the through-holes 46*dt*, respectively as shown in FIG. 4 and FIG. 5.

As shown in FIG. 10A to FIG. 10D, the contact block 12 includes the contact terminals 40*ai*, 40*bi*, 40*ci*, 42*ai*, and 42*bi* (i=1 to n, n is a positive integer) which are formed by using a thin-metal sheet material; the contact holder 14 which holds the contact terminals 40*ai* to 42*bi*; the top stopper member 16 which restrains detachment of the group of contact terminals being held by the contact holder 14 from an upper side; and a side stopper member 18 which restrains detachment of the group of contact terminals from a lateral side.

The three types of contact terminals 40*ai*, 40*bi*, and 40*ci* have the same structure except for positions of respective fixation terminal portions 40*at* at ends of joining portions 40*af*. Accordingly, the contact terminal 40*ai* will be described and explanation of the other contact terminals 40*bi* and 40*ci* will be omitted.

Figure 10A:
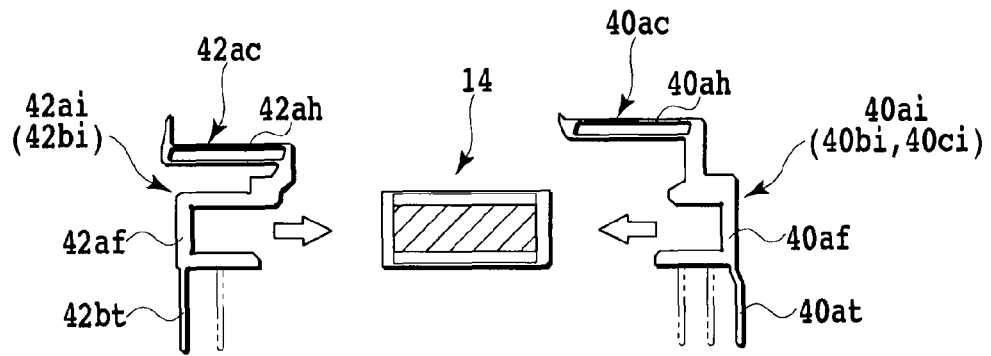
FIG. 10A is a view made available for explanation of assembly procedures for the contact block shown in FIG. 2.
Figure 10B:
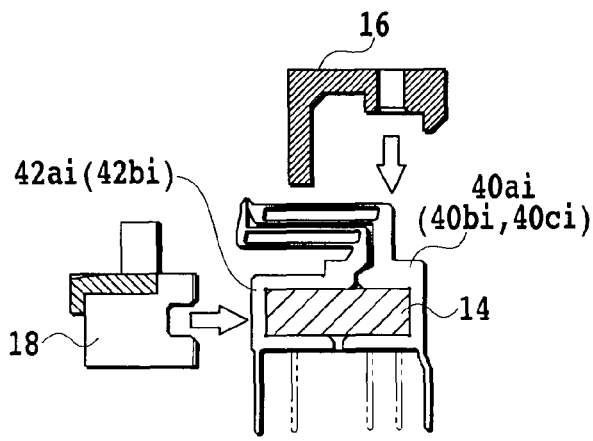
FIG. 10B is a view made available for explanation of the assembly procedures for the contact block shown in FIG. 2.

As shown in the enlarged view of FIG. 10A, the contact terminal 40*ai* is formed by press work and includes a movable piece portion 40*ac* having a contact portion at one end which comes into contact with one terminal (electrode) of the semiconductor device DV, a fixation terminal portion 40*at* which is soldered to the printed wiring board 2, and the joining portion 40*af* which joins the movable piece portion 40*ac* and the fixation terminal portion 40*at*.

The elastically deformable movable piece portion 40*ac* has a slit 40*ah* at its central part. The other end of the movable piece portion 40*ac* is bent and integrally coupled with one of end portions of the joining portion 40*af*. The joining portion 40*af* is formed substantially into a gate shape. Hereby, the movable piece portion 40*ac* extends substantially parallel to the one of the end portions of the joining portion 40*af*.

The fixation terminal portion 40*at* is integrally formed in such a manner as to be perpendicular to the other end portion of the joining portion 40*af*. Meanwhile, in the contact terminal 40*bi*, a coupling position of the fixation terminal portion 40*at* with the joining portion 40*af* is offset toward the left with respect to a right end of the joining portion 40*af* in FIG. 10A as compared to the contact terminal 40*ai*. In the contact terminal 40*ci*, a coupling position of the fixation terminal portion 40*at* with the joining portion 40*af* is located most distant from the right end of the joining portion 40*af*.

The two types of contact terminals 42*ai* and 42*bi* have the same structure each other except for positions of respective fixation terminal portions 42*bt* at ends of joining portions 42*af*. Accordingly, the contact terminal 42*ai* will be described and explanation on the other contact terminal 42*bi* will be omitted.

As shown in the enlarged view of FIG. 10A, the contact terminal 42*ai* is formed by press work and includes a movable piece portion 42*ac* having a contact portion at one end which comes into contact with the one terminal (electrode) of the semiconductor device DV at a given distance away from the contact portion of the contact terminal 40*ai* that comes into contact in common, a fixation terminal portion 42*bt* which is soldered to the printed wiring board 2, and the joining portion 42*af* which joins the movable piece portion 42*ac* and the fixation terminal portion 42*bt*.

The elastically deformable movable piece portion 42*ac* has a slit 42*ah* at its central part. The other end of the movable piece portion 42*ac* is bent and integrally coupled with one of end portions of the joining portion 42*af*. The joining portion 42*af* is formed substantially into a gate shape. The joining portion 42*af* is formed in such a manner as to be cut open in a reverse direction to a direction of cutting open the joining portion 40*af* of the contact terminal 40*ai*. Herewith, the movable piece portion 42*ac* extends substantially parallel to the one of the end portions of the joining portion 42*af*.

The fixation terminal portion 42*at* is integrally formed in such a manner as to be perpendicular to the other end portion of the joining portion 42*af*. Meanwhile, in the contact terminal 42*bi*, a coupling position of the fixation terminal portion 40*at* with the joining portion 42*af* is offset toward the right at a given distance with respect to a left end of the joining portion 40*af* in FIG. 10A as compared to the contact terminal 42*ai*.

Accordingly, the movable piece portions of the contact terminal 40*ai* and the contact terminal 42*ai* form a so-called Kelvin contact.

The contact holder 14 for holding the contact terminals 40*ai* to 42*bi* is made of a resin material, for example, and consists of a contact holding portion 14B to which the contact terminals 40*ai* to 42*bi* are inserted, and fixation end portions 14A and 14C which are integrally formed on both sides of the contact holding portion 14B as shown in the enlarged view of FIG. 8A to FIG. 8E.

Figure 8A:
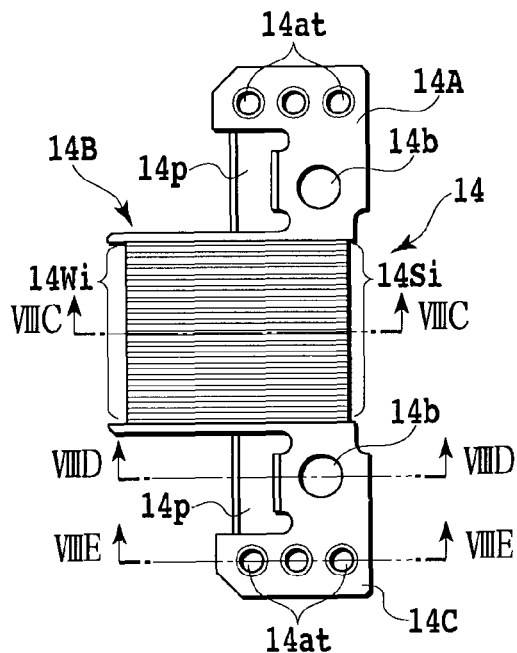
FIG. 8A is a plan view illustrating a contact holder member constituting part of the contact block shown in FIG. 2.
Figure 8B:
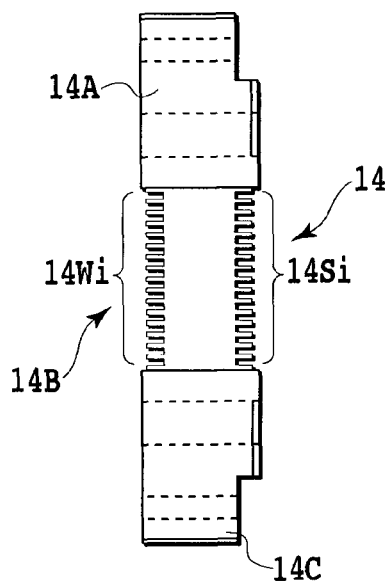
FIG. 8B is a side view of the view shown in FIG. 8A.
Figure 8C:
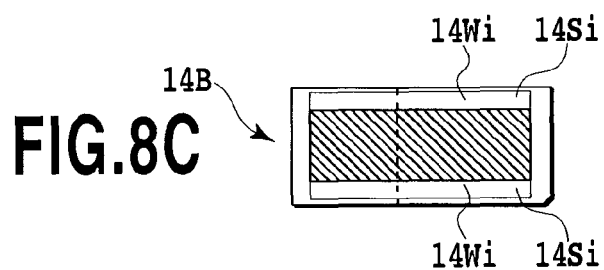
FIG. 8C is a cross-sectional view taken along the VIIIC-VIIIC line in the view shown in FIG. 8A.

As shown in FIG. 8A to FIG. 8C, the contact holding portion 14B has slit portions 14S*i* (i=1 to n, n is a positive integer) provided at given intervals in an outer peripheral portion of a rectangular cross section. The joining portions of the contact terminals 40ai to 42bi are respectively inserted into the slit portions 14Si. The adjacent slit portions 14Si are partitioned by partition walls 14Wi (i=1 to n, n is a positive integer).

When the contact blocks 12 are attached to the contact block accommodation portions 46A and 46C, for example, the slit portions 14Si are formed such that the contact portions of the contact terminals 42ai to 42bi are arranged along the coordinate axis Y in FIG. 6. For instance, the contact terminal 40ai and the contact terminal 42ai are face-to-face inserted to the one common slit portion 14Si as shown in FIG. 3.

The fixation end portions 14A and 14C are respectively supported by and fixed to the mounting surfaces 46af of the contact block accommodation portion 46A described above. As shown in FIG. 8E, through-holes 14at constituting part of the position adjusting means for the contact block are formed in three positions at equal intervals A on a common straight line and along the aforementioned position adjustment direction in each of the fixation end portions 14A and 14C.

Figure 1:
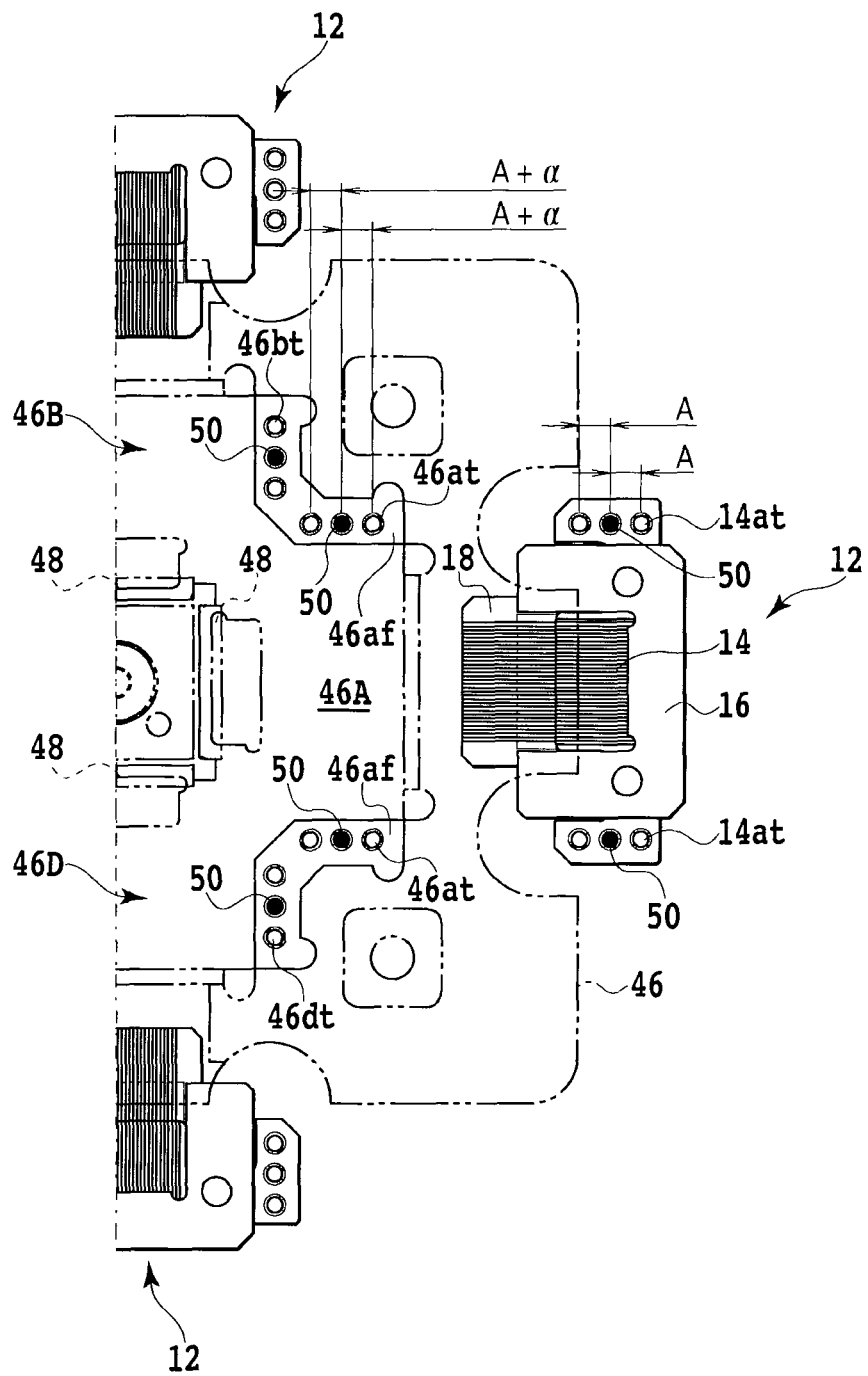
FIG. 1 is a plan view showing a contact block housing member in a first embodiment of a semiconductor device socket according to the present invention together with contact blocks.

When the fixation end portions 14A and 14C are respectively supported by and fixed to the mounting surfaces 46af of the contact block accommodation portion 46A described above, the one end of the positioning pin 50 is selectively inserted to the above-described through-hole 46at through one through-hole 14at out of the three through-holes 14at as shown in FIG. 4. At this time, as shown in FIG. 1, mutual intervals among the three through-holes 46at are set to a value (A+α) which is greater by a given value a than the aforementioned intervals A. Moreover, mutual intervals among three through-holes 46bt and 46dt are set similarly. Note that the numbers of the through-holes 46a, 46bt or 46dt are not limited to three and it is possible to form three or more holes or to provide two holes. Moreover, the intervals between the three holes 46a (46bt and 46dt) in each of the rows of through holes 46a (46bt and 46dt) are assumed to be set equal in the above-described example. However, the intervals do not always have to be set as described above. For instance, the intervals therebetween may be set to different values.

Figure 8D:
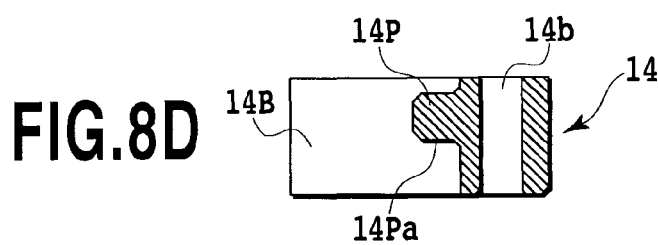
FIG. 8D is a cross-sectional view taken along the VIIID-VIIID line in the view shown in FIG. 8A.
Figure 8E:
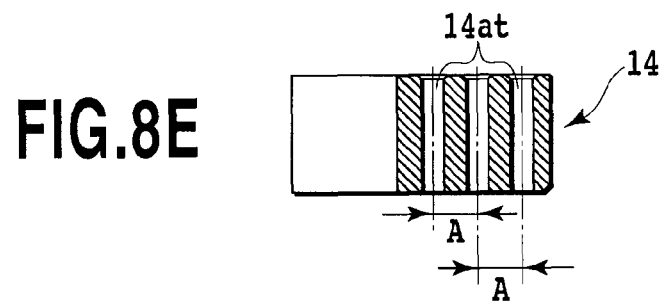
FIG. 8E is a cross-sectional view taken along the VIIIE-VIIIE line.

As shown in FIG. 8D, a through-hole 14b is formed between the contact holding portion 14B and the through-holes 14at in each of the fixation end portions 14A and 14C. Unillustrated machine screws are inserted to the through-holes 14b.

Meanwhile, protrusions 14P are respectively formed in positions of the fixation end portions 14A and 14C opposed to the respective through-holes 14b. Projections 14Pa are formed in the respective protrusions 14P. As indicated with chain double-dashed lines in FIG. 7E, the protrusions 14P and projections 14Pa are fitted in a recess 18R in the side stopper member 18.

As shown in FIG. 7A to FIG. 7E, the side stopper member 18 consists of a contact holding portion 18B to which the movable piece portions of the contact terminals 40ai to 42bi are inserted, and fixation end portions 18A and 18C which are integrally formed at a given interval on both sides of the contact holding portion 18B.

As shown in FIG. 7A to FIG. 7C, the contact holding portion 18B has slit portions 18Si (i=1 to n, n is a positive integer) provided at given intervals. The movable piece portions 40ac and 42ac of the contact terminals 40ai to 42bi are respectively inserted into the slit portions 18Si. The adjacent slit portions 18Si are partitioned by partition walls 18Wi (i=1 to n, n is a positive integer).

When the contact blocks 12 are attached to the contact block accommodation portions 46A and 46C, for example, the slit portions 18Si are formed so as to correspond to the slit portions 14Si of the contact holding portion 14B described above.

Figure 10C:
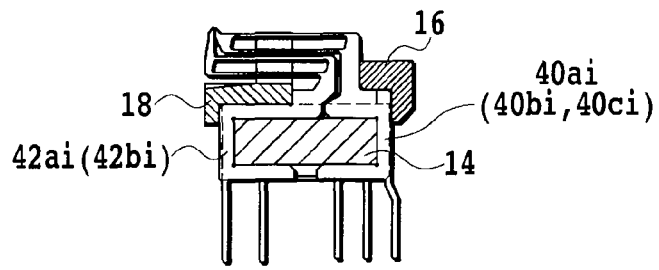
FIG. 10C is a view made available for explanation of the assembly procedures for the contact block shown in FIG. 2.
Figure 10D:
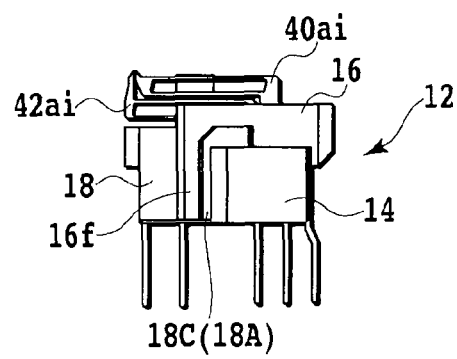
FIG. 10D is a view made available for explanation of the assembly procedures for the contact block shown in FIG. 2.

For example, the movable piece portion 40ac of the contact terminal 40ai and the movable piece portion 42ac of the contact terminal 42ai are inserted into the one common slit portion 18Si so as to be parallel to each other as shown in FIG. 10C. Hereby the movable piece portion 40ac of the contact terminal 40ai and the movable piece portion 42ac of the contact terminal 42ai are guided by a pair of partition walls 18Wi and arranged on a common plane.

Meanwhile, the recesses 18R in which the above-described protrusions 14P and projections 14Pa are fitted are respectively formed in the fixation end portions 18A and 18C. A hollow 18D is formed between the fixation end portions 18A and 18C. An inner surface 18d to be engaged with the joining portions 42af of the contact terminals 42ai and 42bi is formed inside a portion be continued to the slit portions 18Si of the contact holding portion 18B. Herewith movements of the joining portions 42af of the contact terminals 42ai and 42bi are restrained by the inner surface 18d when the side stopper member 18 is attached to the contact holder 14.

As shown in FIG. 9A to FIG. 9E, the top stopper member 16 consists of a contact holding portion having a position restriction surface 16e to be engaged with the joining portion 40af of the contact terminal 40ai, and a pair of leg portions 16f extending perpendicularly to the contact holding portion.

The contact holding portion is formed substantially into a gate shape and is provided with an opening 16k in the center. Moreover, through-holes 16b to which unillustrated machine screws are inserted are formed in two positions around the opening 16k.

Figure 9A:
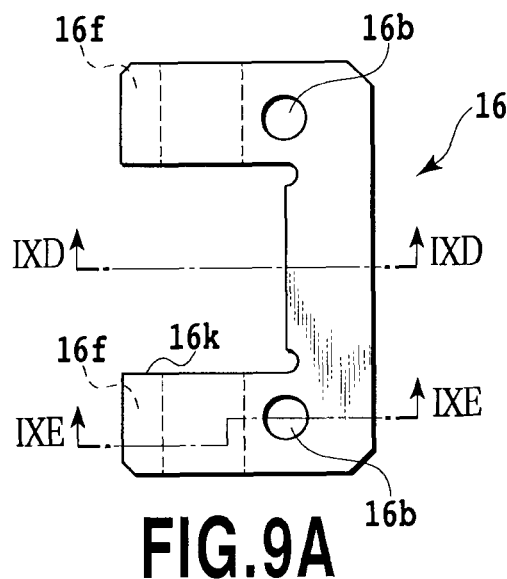
FIG. 9A is a plan view illustrating a top stopper member constituting part of the contact block shown in FIG. 2.
Figure 9D:
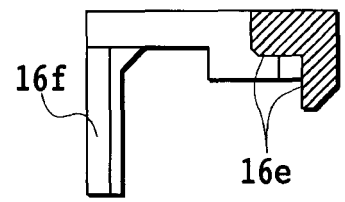
FIG. 9D is a cross-sectional view taken along the IXD-IXD line in the view shown in FIG. 9A.
Figure 9B:
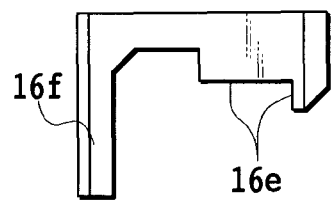
FIG. 9B is a front view of the view shown in FIG. 9A.
Figure 9E:
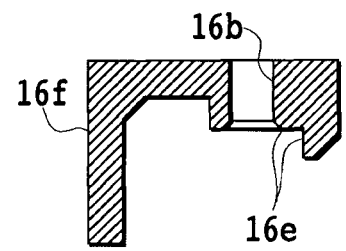
FIG. 9E is a cross-sectional view taken along the IXE-IXE line in the view shown in FIG. 9A.
Figure 9C:
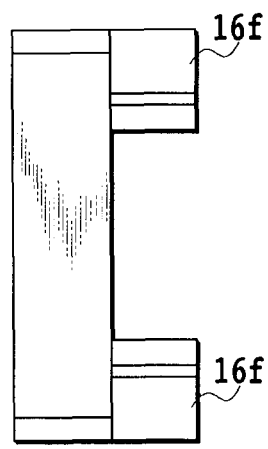
FIG. 9C is a side view of the view shown in FIG. 9A.

The pair of leg portions 16f are formed integrally with the contact holding portion at a given interval as shown in FIG. 9C. When the top stopper member 16 is attached to the contact holder 14, the pair of leg portions 16f are respectively engaged with projections 18Pa which are formed in the fixation end portions 18A and 18C of the side stopper member 18. Hereby the group of contact terminals will not come off the above-described contact holder even when machine screws to be described later are not fastened.

When the contact block 12 is assembled in accordance with the above-described configuration, as shown in FIG. 10A to FIG. 10D, the respective joining portions of the contact terminals 40ai to 42bi are first inserted into the slits 14Si of the contact holder 14 along a direction indicated with an arrow. Next, the side stopper member 18 is attached to the contact holder 14 along a direction indicated with an arrow. Subsequently, the top stopper member 16 is placed from above onto the contact holder 14 after the contact terminals 40ai to 42bi are inserted into the slits 14Si, whereby the assembly of the contact block 12 is completed. Moreover, the group of contact terminals may not come off the contact holder 14 owing to the top stopper member 16 and the side stopper member. And then, the machine screws are inserted into the through-holes 16b of the top stopper member 16 and to the holes 14b of the contact holder 14 that attaches the side stopper 18, and are then fastened with nuts and the like. Thus the assembly of the contact block 12 is completed. In the meantime, the respective contact blocks are screwed into the contact block housing member by these machine screws.

As shown in FIG. 5, the contact blocks 12 thus assembled are attached to the respective contact block accommodation portions 46A to 46D in such a manner that a group of contact points thereof form a rectangular frame adjacent to and around the spring receiving hole 46SR. Thereafter, the one end of the positioning pin 50 is inserted to the through-hole 46*at* located second from the end of the contact block accommodation portion 46A via the through-hole 14*at* located second from the end of the contact holder 14 as shown in FIG. 4, for example. Moreover, the elastic member 48 provided at the contact block accommodation portion 46A can absorb a clearance between an outer peripheral surface of the positioning pin 50 and an inner peripheral surface of the through-holes 14*at* and 46*at*. Accordingly, it is possible to position the contact block 12 accurately in the contact block accommodation portion 46A. Then, the adapter plate 44 is placed on the upper end surface of the contact block housing member 46 and the base member 24 and the lid member 22 are fixed to the adapter plate 44. At that time, the other end of the positioning pin 50 is inserted into the opening 44*a* (see FIG. 4) of the adapter plate 44.

In the above-described example, the contact block 12 is assumed to include the three types of contact terminals 40*ai*, 40*bi*, and 40*ci* and the two types of contact terminals 42*ai* and 42*bi*, which are arranged at the opposite sides of the contact holder 14. However, the types of contact terminals is not limited only to this example. For instance, a single type of contact terminals or two types of contact terminals may be arranged opposite to one another along at the opposite sides of the contact holder 14 so that intervals between the contact terminals in the arrangement direction correspond to intervals of terminals of a semiconductor device.

Figure 12A:
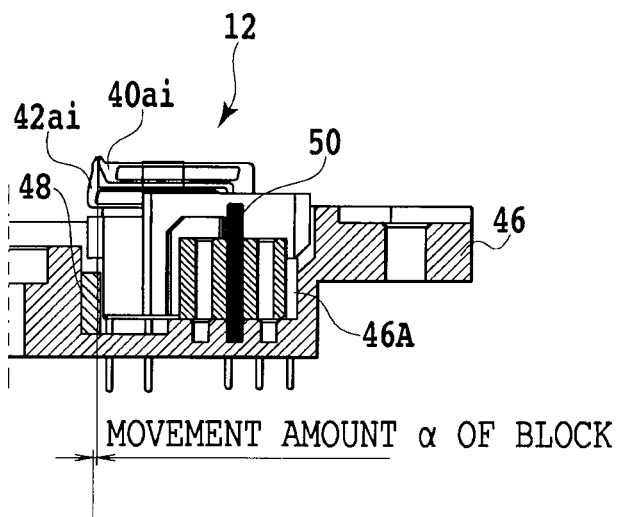
FIG. 12A is a partial cross-sectional view made available for explanation of position adjustment of the contact block in the first embodiment.

Further, a case of adjusting relative positions of the contact terminals 40*ai* to 40*ci* and the contact terminals 42*ai* and 42*bi* in the contact block 12 with respect to the terminals of the semiconductor device DV will be described. For example, in the contact block accommodation portion 46A as shown in FIG. 12A, the one end of the positioning pin 50 for the contact block 12 is assumed to have been inserted to the through-hole 46*at* located second from the end of the contact block accommodation portion 46A via the through-hole 14*at* located second from the end of the contact holder 14. Now, the relative positions of the contact portions of the contact terminals 40*ai* to 40*ci* and the contact terminals 42*ai* and 42*bi* in the contact block 12 with respect to the terminals of the semiconductor device DV are assumed to be adjusted so as to move closer to the semiconductor device mounting stage 30 by the given value α.

Figure 11:
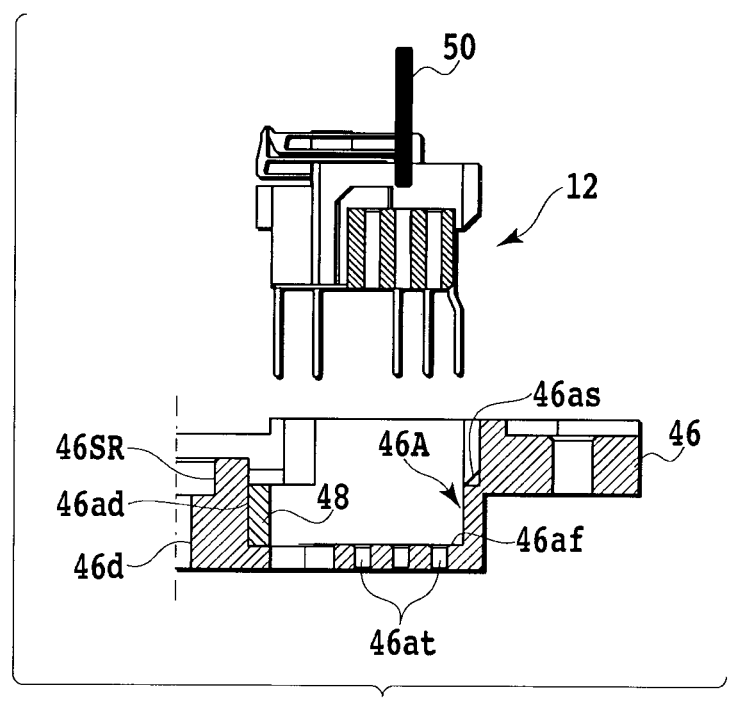
FIG. 11 is a cross-sectional view showing a state where the contact block in FIG. 4 is detached.
Figure 12B:
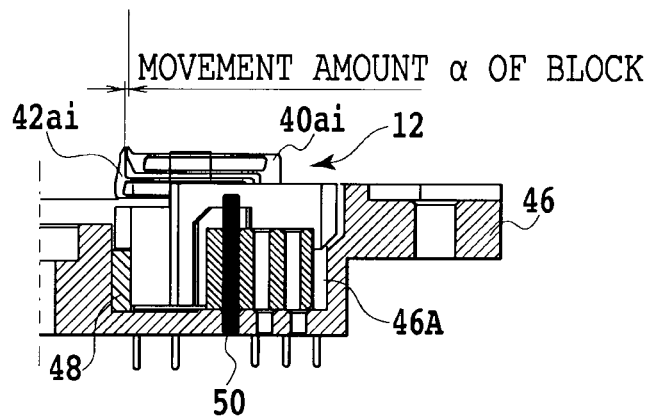
FIG. 12B is a partial cross-sectional view made available for explanation of the position adjustment of the contact block in the first embodiment.

In that case, the contact block 12 is once detached from the contact block accommodation portion 46A. Then, the positioning pin 50 is pulled out as shown in FIG. 11. Next, as shown in FIG. 12B, the one end of the positioning pin 50 is inserted into the through-hole 46*at* located at the left end via the through-hole 14*at* located at the farthest to left end of the contact holder 14.

The through-hole 46*at* at the farthest to left end is located away from the adjacent through-hole 46*at* by the value (A+α). Thus the entire contact block 12 is brought closer to the semiconductor device mounting stage 30 by the value α. Hereby, the relative positions of the contact portions of the contact terminals 40*ai* to 40*ci* and the contact terminals 42*ai* and 42*bi* in the contact block 12 with respect to the terminals of the semiconductor device DV are adjusted so as to move closer to the semiconductor device mounting stage 30 by the given value α. Accordingly, the position adjusting means for the relative positions of the contact portions of the contact terminals 40*ai* to 40*ci* and the contact terminals 42*ai* and 42*bi* in the contact blocks 12 with respect to the terminals of the semiconductor device DV is formed by the positioning pins 50, the multiple through-holes 14*at* on the contact holder 14, and the multiple through-holes 46*at* on the contact block accommodation portions 46A to 46D.

Figure 13:
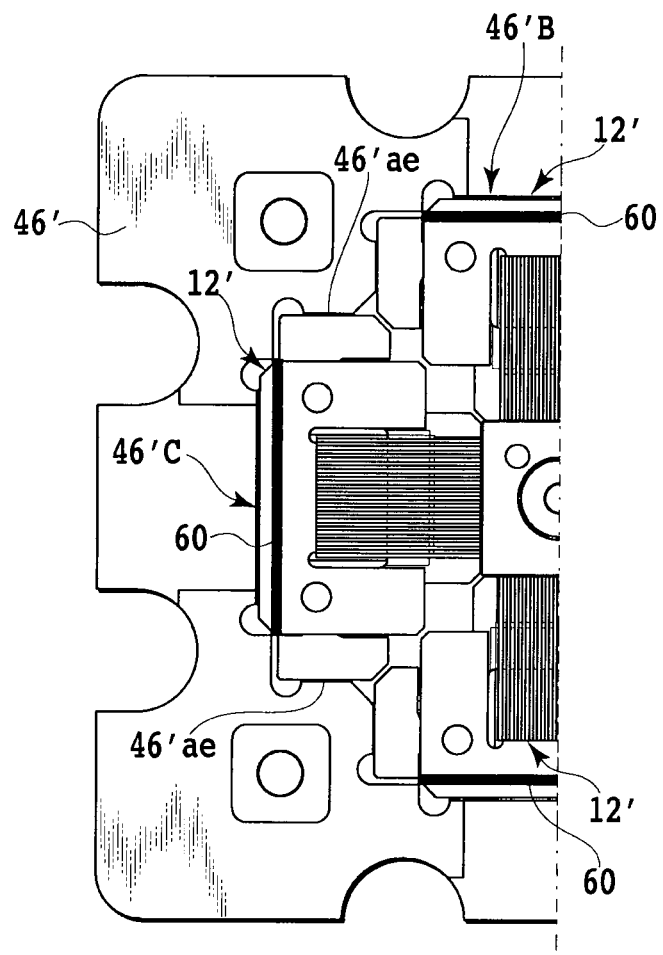
FIG. 13 is a plan view showing a contact block housing member in a second embodiment of a semiconductor device socket according to the present invention together with contact blocks.

FIG. 13 shows a contact block housing member 46' in a second embodiment of a semiconductor device socket according to the present invention together with contact blocks 12' attached thereto.

Note that in FIG. 13 to FIG. 17A and FIG. 17B, the same constituents as those in the example shown in FIG. 3 will be designated by the same reference numerals and duplicate explanation thereof will be omitted.

In this example as well, a pressing mechanism including a base member 24 and a lid member 22 as shown in FIG. 3 is adapted to be fixed to an upper end surface of the contact block housing member 46' disposed on a printed wiring board 2 through an adapter plate 44.

In the example shown in FIG. 1, the position adjusting means for the relative positions of the contact portions of the contact terminals 40*ai* to 40*ci* and the contact terminals 42*ai* and 42*bi* in the contact blocks 12 with respect to the terminals of the semiconductor device DV is formed by the positioning pins 50, the multiple through-holes 14*at* in the contact holder 14, and the multiple through-holes 46*at* in the contact block accommodation portions 46A to 46D. On the other hand, in the example shown in FIG. 13, the position adjusting means includes a spacer member 60 and a spacer member 62 (see FIG. 17B) having different thicknesses instead of the positioning pins 50 and the like.

In FIG. 13 to FIG. 16, the contact block housing member 46' has a semiconductor device mounting stage 30 which is located at the central part. Contact block accommodation portions 46'A (not shown), 46'B, 46'C, and 46'D are formed substantially in a crisscross shape around the semiconductor device mounting stage 30 at an interval of 90° along a circumferential direction. The contact block accommodation portions 46'A, 46'B, 46'C, and 46'D communicate with one another, and respective contact blocks 12' to be described later are detachably housed therein as shown in FIG. 13. Since the contact block accommodation portions 46'A, 46'B, 46'C, and 46'D have the same structure each other, the contract block accommodation portion 46'C will be described and explanation on the other contact block accommodation portions 46'A to 46'D will be omitted.

Relief portions 46'*ar* are formed to be opposed to each other in inner peripheral surfaces which form the contact block accommodation portion 46'C. The relief portions 46'*ar* are formed at portions where inner peripheral surfaces along a direction intersecting a coordinate axis Y of orthogonal coordinates X and Y shown in FIG. 15 (parallel to a coordinate axis X), i.e., in a direction substantially orthogonal to a direction of arrangement of the contact terminals, cross an inner peripheral surface along the coordinate axis Y. Each corner portion at an outer peripheral portion of the contact block 12' is inserted to each of the relief portions 46'*ar*. Moreover, two groove portions 46'*ag* are formed at a given interval between the relief portions 46'*ar* in the inner peripheral surfaces along the coordinate axis Y. A recess 46' as is formed between the two groove portions 46'*ag*. Part of an outer peripheral portion of a top stopper member 16 of the contact block 12' to be described later is inserted to the recess 46'*as*. The spacer member 60 constituting part of the position adjusting means comes into contact with a position below the recess 46'*as* in the inner peripheral surface. Meanwhile, the spacer member 60 is brought into contact with a contact surface in the outer peripheral portion of the contact block 12'. The spacer member 60 having a given plate thickness A is a thin-plate member which is made of a metal material, for example, and is provided with a surface finished at relatively high accuracy.

Figure 15:
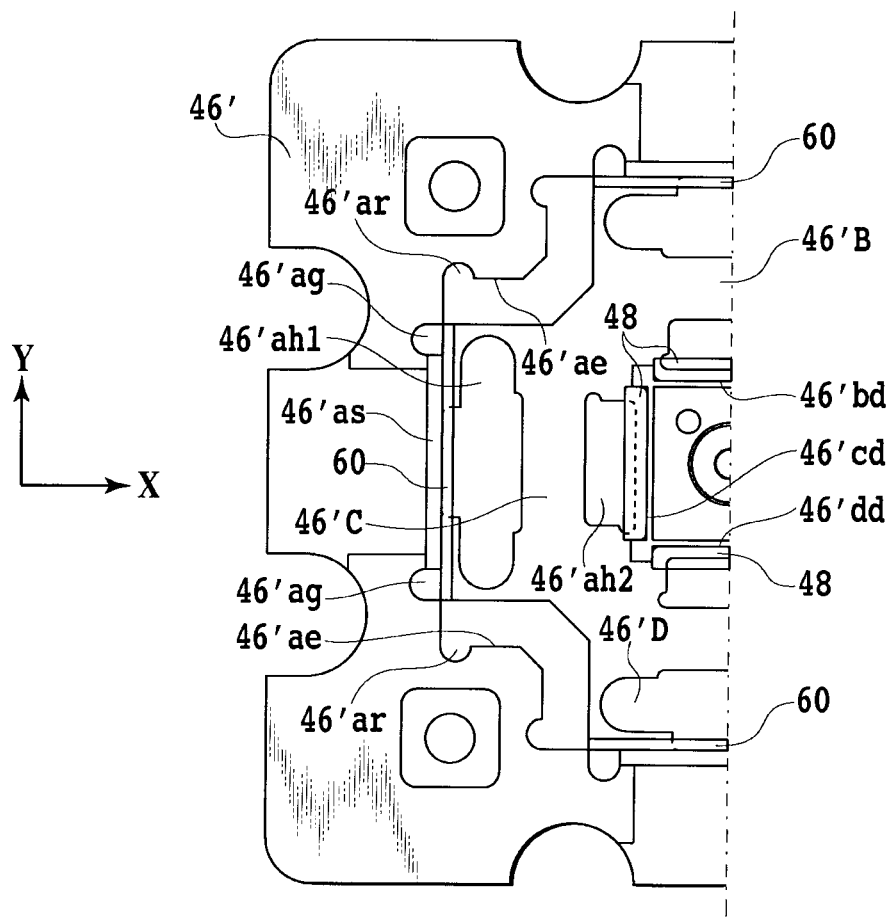
FIG. 15 is a plan view illustrating a state where the contact blocks in the example shown in FIG. 13 are detached.
Figure 16:
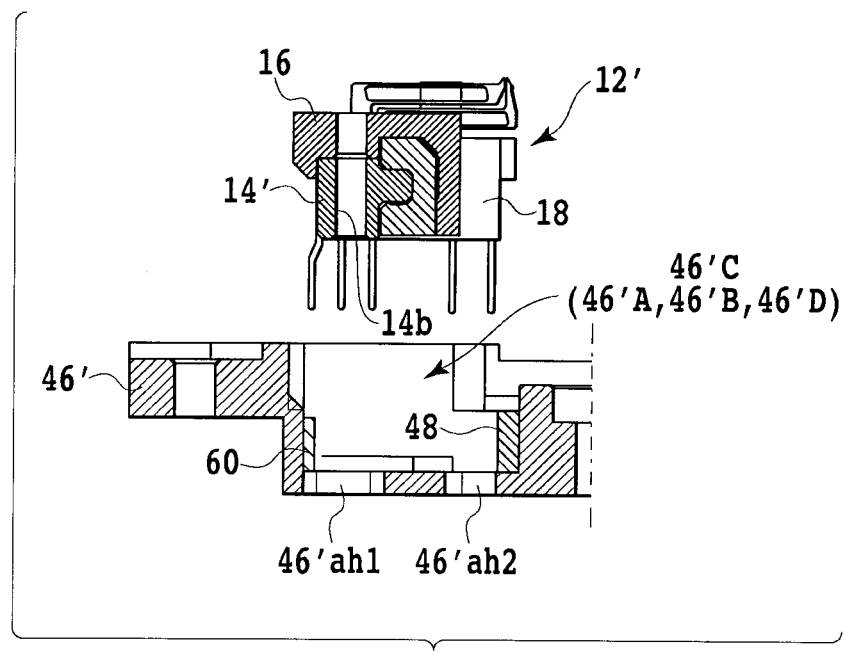
FIG. 16 is a cross-sectional view showing a state where the contact blocks in FIG. 14 are detached.

Positioning surfaces 46'*ae* configured to position the outer peripheral portion of the top stopper member 16 of the contact block 12' are formed in the inner peripheral surfaces along the X coordinate axis in FIG. 15 continued to the respective relief portions 46'*ar* described above.

A thin-plate elastic member 48 is provided at a recess 46'*cd*, which is formed at a portion facing the recess 46'*as* in the inner peripheral surface that forms the contact block accommodation portion 46'C. The elastic member 48 is adapted to use its elastic force to bias the attached contact block 12' toward the spacer member 60.

Note that recesses 46'*bd* and 46'*dd* in the contact block accommodation portions 46'B and 46'D are similarly provided with elastic members 48. A recess in the unillustrated contact block accommodation portion 46'A is also provided with a similar elastic member 48.

Figure 14:
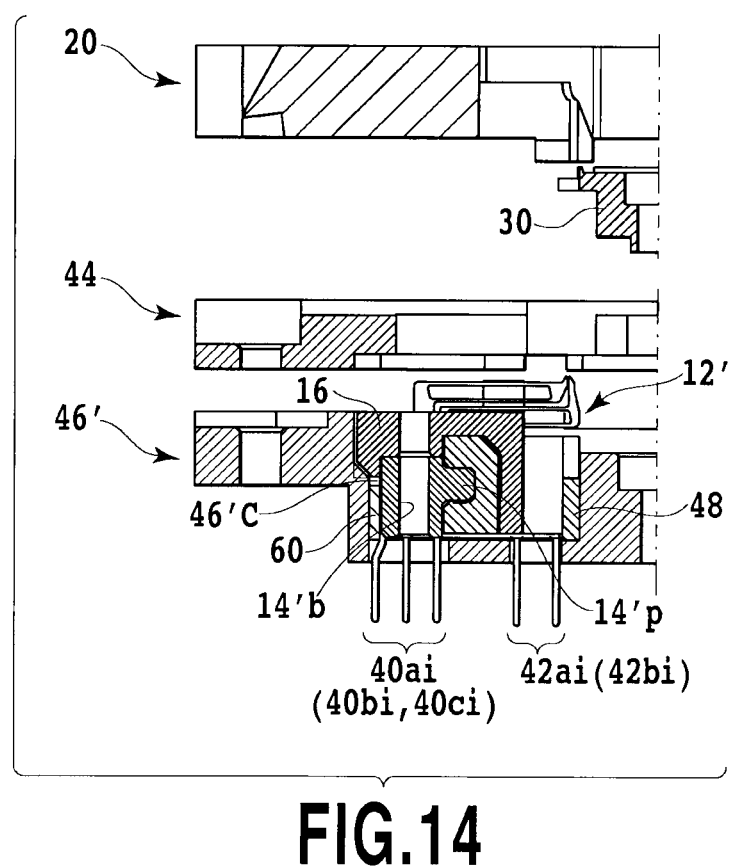
FIG. 14 is a partial cross-sectional view illustrating disassembly of the second embodiment of the semiconductor device socket according to the present invention.

As shown in FIG. 15, openings 46'*ah*1 and 46'*ah*2 are formed at a given interval in a bottom portion that forms the contact block accommodation portion 46'C. As shown in FIG. 14, a group of fixation terminals of contact terminals 40*ai*, 40*bi*, 40*ci*, 42*ai*, and 42*bi* in the contact block 12' penetrate the openings 46'*ah*1 and 46'*ah*2. The openings 46'*ah*1 and 46'*ah*2 extend in the direction along the above-mentioned coordinate axis Y. An opening area of the opening 46'*ah*1 is set greater than an opening area of the opening 46'*ah*2.

The contact block 12' includes the above-mentioned contact terminals 40*ai*, 40*bi*, 40*ci*, 42*ai*, and 42*bi*; a contact holder 14' which holds the contact terminals 40*ai* to 42*bi*; the top stopper member 16 which restrains detachment of the group of contact terminals being held by the contact holder 14' from an upper side; and a side stopper member 18 which restrains detachment of the group of contact terminals from a lateral side.

The contact holder 14' for holding the contact terminals 40*ai* to 42*bi* is made of a resin material, for example, and consists of a contact holding portion to which the contact terminals 40*ai* to 42*bi* are inserted, and a pair of fixation end portions which are integrally formed on both sides of the contact holding portion 14B.

The contact holding portion 14B has slit portions provided at given intervals in an outer peripheral portion of a rectangular cross section. Joining portions of the contact terminals 40*ai* to 42*bi* are respectively inserted into the slit portions. The adjacent slit portions are partitioned by partition walls.

When the contact blocks 12' are attached to the contact block accommodation portions 46'C and 46'A, for example, the slit portions are formed such that contact portions of the contact terminals 40*ai* to 42*bi* are arranged along the above-mentioned coordinate axis Y. For example, the contact terminal 40*ai* and the contact terminal 42*ai* are inserted to the one common slit portion so as to face each other.

The pair of fixation end portions are respectively supported by and fixed to mounting surfaces of the contact block accommodation portion 46'C described above.

Through-holes 14'*b* (see FIG. 14) are respectively formed in the pair of fixation end portions on both sides of contact holding portion. Unillustrated machine screws are inserted to the through-holes 14'*b*.

Meanwhile, protrusions 14'P are respectively formed in positions in the pair of fixation end portions opposed to the respective through-holes 14'*b*. The protrusions 14'P are each fitted in a recess 18R of the side stopper member 18.

Figure 17A:
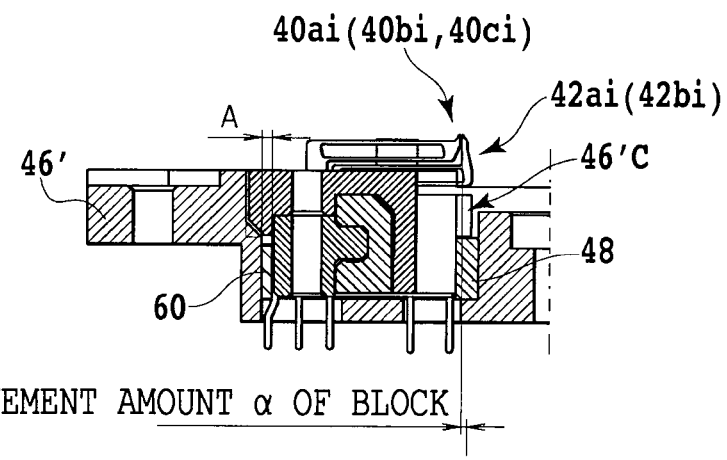
FIG. 17A is a partial cross-sectional view made available for explanation of position adjustment of the contact block in the second embodiment.
Figure 17B:
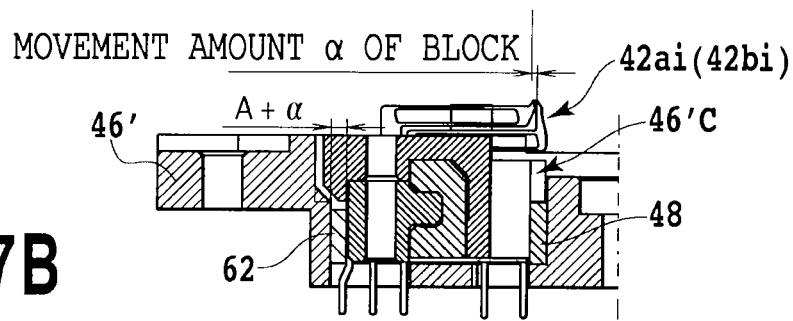
FIG. 17B is a partial cross-sectional view made available for explanation of the position adjustment of the contact block in the second embodiment.

In this configuration, a case of adjusting relative positions of the contact terminals 40*ai* to 40*ci* and the contact terminals 42*ai* and 42*bi* in the contact block 12' with respect to terminals of a semiconductor device DV will be described. For example, in the contact block accommodation portion 46'C as shown in FIG. 17A, the contact block 12' is assumed to have been positioned between the spacer portion 60 and the elastic member 48. Now, the relative positions of contact portions of the contact terminals 40*ai* to 40*ci* and the contact terminals 42*ai* and 42*bi* in the contact block 12' with respect to terminals of the semiconductor device DV are assumed to be adjusted so as to move closer to the semiconductor device mounting stage 30 by a given value $\alpha$. In that case, the contact block 12' and the spacer member 60 are once detached from the contact block accommodation portion 46'C. Then, the spacer member 62 having a plate thickness (A+$\alpha$) greater than the plate thickness A of the spacer member 60 is inserted to a position below the recess 46'*as* of the inner peripheral surface as shown in FIG. 17B.

Hereby, since the thickness of the spacer member 62 is greater by a value ($\alpha$) than the thickness of the spacer member 60, the entire contact block 12' is brought closer to the semiconductor device mounting stage 30 by the value $\alpha$. Accordingly, the relative positions of the contact portions of the contact terminals 40*ai* to 40*ci* and the contact terminals 42*ai* and 42*bi* in the contact block 12' with respect to the terminals of the semiconductor device DV are adjusted so as to move closer to the semiconductor device mounting stage 30 by the given value $\alpha$.

In a first embodiment and a second embodiment described above, each of the contact blocks 12 and 12' are provided with the three types of contact terminals 40*ai* to 40*ci* and the two types of contact terminals 42*ai* and 42*bi*, or namely, the Kelvin contact.

Figure 18:
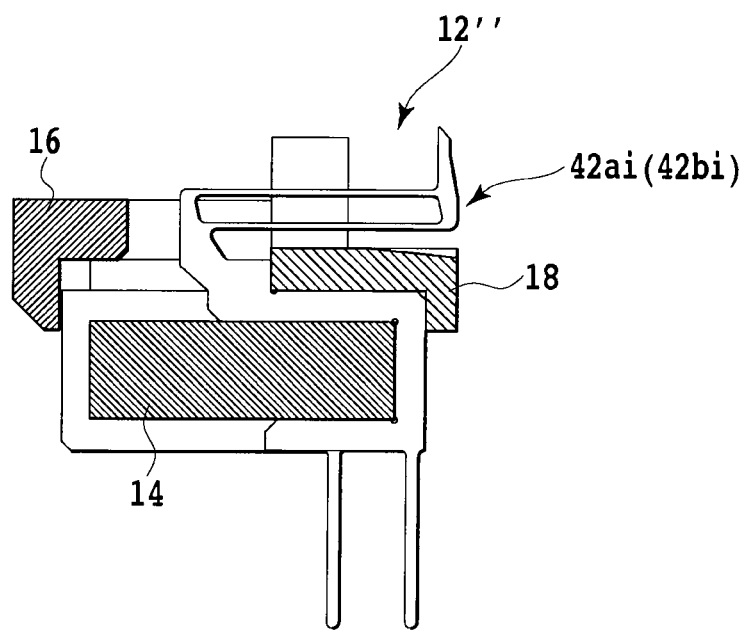
FIG. 18 is a cross-sectional view showing a variant example of the contact block.

Nevertheless, the above-described configuration is not necessarily provided. For instance, as shown in FIG. 18, a contact block 12" may be provided only with the two types of contact terminals 42*ai* and 42*bi* instead of comprising the Kelvin contact. Alternatively, although illustration is omitted, it is also possible to provide only the contact terminals 40*ai* and 40*bi*. In FIG. 18, the same constituents as those shown in FIG. 10A to FIG. 10D will be designated by the same reference numerals and duplicate explanation thereof will be omitted.

In addition, in a first embodiment and a second embodiment described above, the fixation terminal portions of the three types of contact terminals 40*ai* to 40*ci* and the two types of contact terminals 42*ai* and 42*bi* in the contact blocks 12 and 12' are soldered to the printed wiring board 2.

Figure 19B:
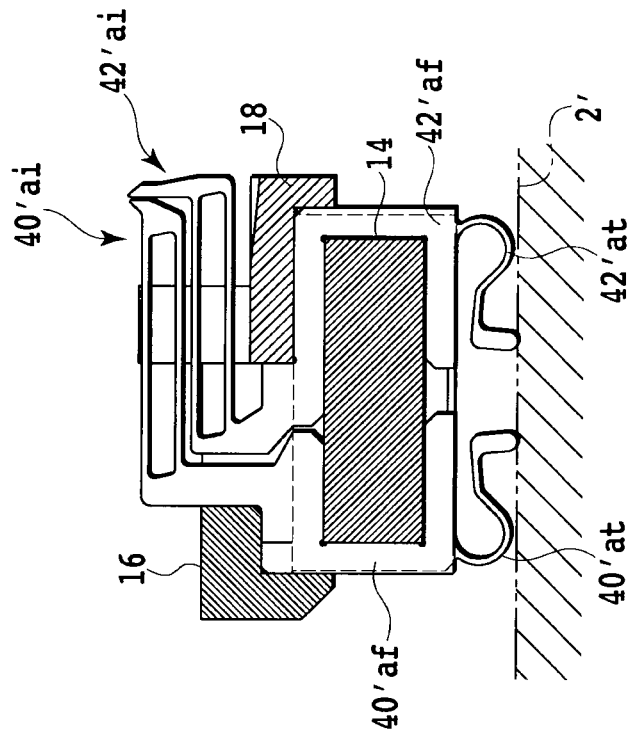
FIG. 19B is a cross-sectional view showing the other example of the contact terminals in the contact block.
Figure 19A:
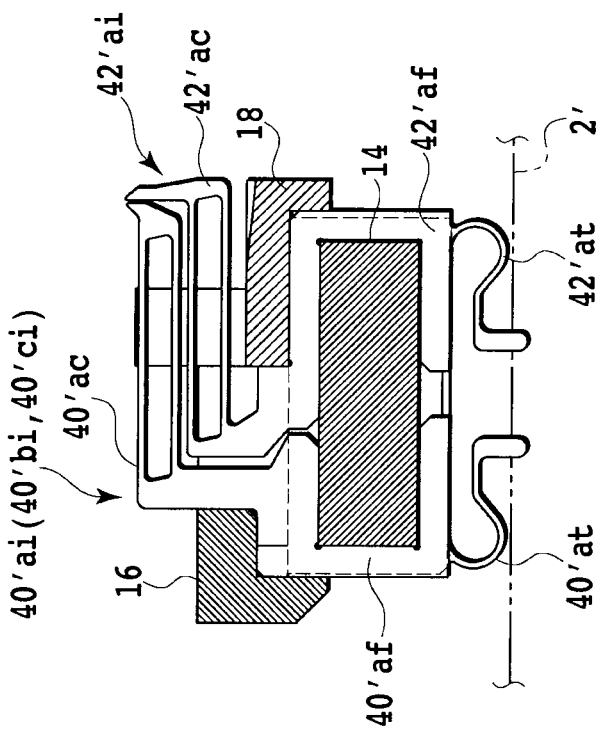
FIG. 19A is a cross-sectional view showing another example of contact terminals in the contact block.

However, without limitation to the foregoing examples, each of fixation terminal portions of contact terminals 40'*ai* to 40'*ci* and contact terminals 42'*ai* and 42'*bi* may be provided with an elastic fixation terminal portion 40'*at* or 42'*at* in a curved shape as shown in the enlarged view of FIG. 19A. In FIG. 19A and FIG. 19B, the same constituents as those shown in FIG. 10A to FIG. 10D will be designated by the same reference numerals with primes (') added thereto and duplicate explanation thereof will be omitted.

The fixation terminal portions of the contact terminals 40'*ai* to 40'*ci* and of the contact terminals 42'*ai* and 42'*bi* are mounted on a mounting surface of a printed wiring board 2' which is different from the printed wiring board 2. A group of prescribed contact pads to be conducted to an unillustrated electrically conductive layer inside the board are formed on the mounting surface.

The three types of contact terminals 40'*ai* to 40'*ci* have the same structure each other except for positions of the respective fixation terminal portions 40'*at* at ends of joining portions 40'*af*. Accordingly, the contact terminal 40'*ai* will be described and explanation on the other contact terminals 40'*bi* and 40'*ci* will be omitted.

The contact terminal 40'ai is formed by press work and includes a movable piece portion 40'ac having a contact portion at one end which comes into contact with one terminal (electrode) of a semiconductor device DV; the fixation terminal portion 40' at which comes into contact with the contact pad on the printed wiring board 2' at a given pressure; and the joining portion 40'af which joins the movable piece portion 40'ac and the fixation terminal portion 40'at.

The fixation terminal portion 40'at in the curved shape is provided with a contact portion at one end which comes into contact with the contact pad, and is integrally formed in such a manner as to be perpendicular to the other end portion at the joining portion 40'af. Herewith, when the contact block housing member to which the above-described contact block is attached is disposed on the printed wiring board 2', the fixation terminal portion 40'at is pressed and displaced with the contact portion touching on the contact pad as shown in FIG. 19B.

The two types of contact terminals 42'ai and 42'bi have the same structure each other except for positions of the respective fixation terminal portions 42'at at ends of joining portions 42'af. Accordingly, the contact terminal 42'ai will be described and explanation on the other contact terminal 42'bi will be omitted.

The contact terminal 42'ai is formed by press work and includes a movable piece portion 42'ac having a contact portion at one end which comes into contact with the one terminal (electrode) of the semiconductor device DV at a given distance away from the contact portion of the contact terminal 40'ai that comes into contact in common; the fixation terminal portion 42'at which comes into contact with the printed wiring board 2' at a given pressure; and the joining portion 42'of which joins the movable piece portion 42'ac and the fixation terminal portion 42'bt.

The fixation terminal portion 42'at in the curved shape is integrally formed in such a manner as to be perpendicular to the other end portion at the joining portion 42'af. Hereby, when the contact block housing member to which the above-described contact block is attached is disposed on the printed wiring board 2', the fixation terminal portion 42'at is pressed and displaced with the contact portion touching on the contact pad as shown in FIG. 19B.

Therefore, the above-described contact block also forms the so-called Kelvin contact by use of the movable piece portions of the contact terminal 40'ai and the contact terminal 42'ai. Moreover, since the contact block does not have to be soldered to the printed wiring board 2', position adjustment and replacement of the contact block are made easier.

Figure 20:
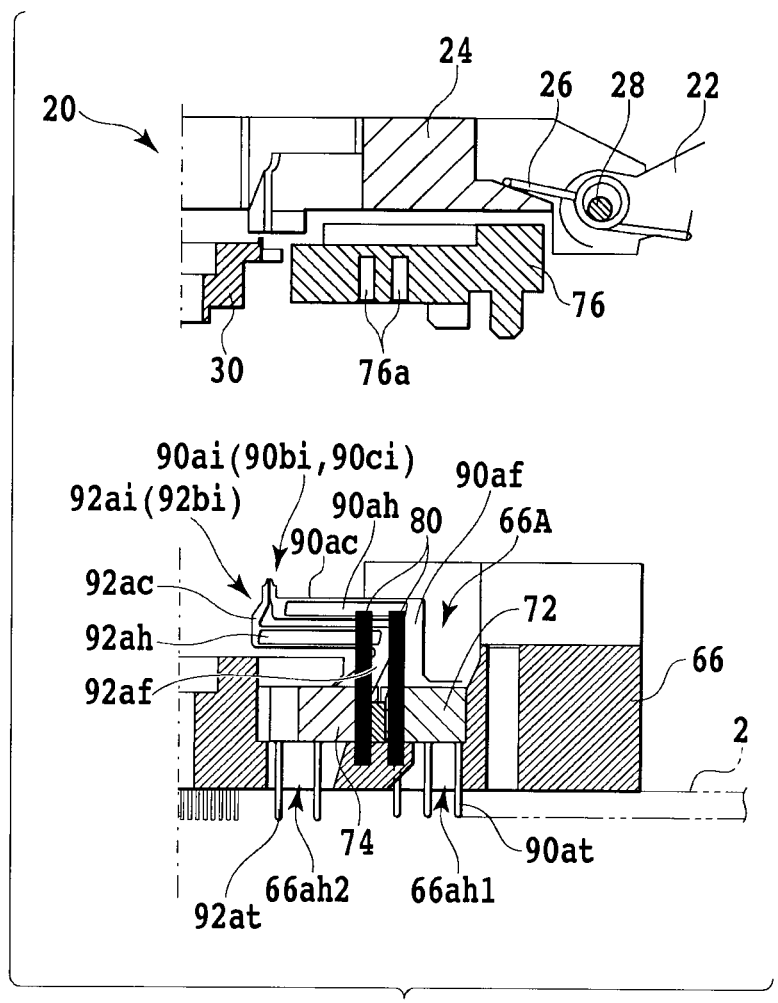
FIG. 20 is a partial cross-sectional view illustrating disassembly of a third embodiment of a semiconductor device socket according to the present invention.

FIG. 20 shows a contact block housing member 66 in a third embodiment of a semiconductor device socket according to the present invention together with contact blocks 72 and 74 attached thereto.

the first embodiment shown in FIG. 1 and the second embodiment shown in FIG. 13 are configured to attach a single contact block into each of the contact block accommodation portions. On the other hand, the example shown in FIG. 20 is configured to attach a set of contact blocks, which are composed of two contact blocks 72 and 74, into each of contact block accommodation portions. At that time, the set of contact blocks form a so-called Kelvin contact by use of movable piece portions of a contact terminal 90ai and a contact terminal 92ai included in the set of contact blocks as will be described later.

In FIG. 20, the same constituents as those in the example shown in FIG. 3 will be designated by the same reference numerals and duplicate explanation thereof will be omitted.

In FIG. 20, a semiconductor device socket includes a pressing mechanism 20 and a socket body. The socket body is provided with the contact block housing member 66 and an adapter plate 76.

Figure 21:
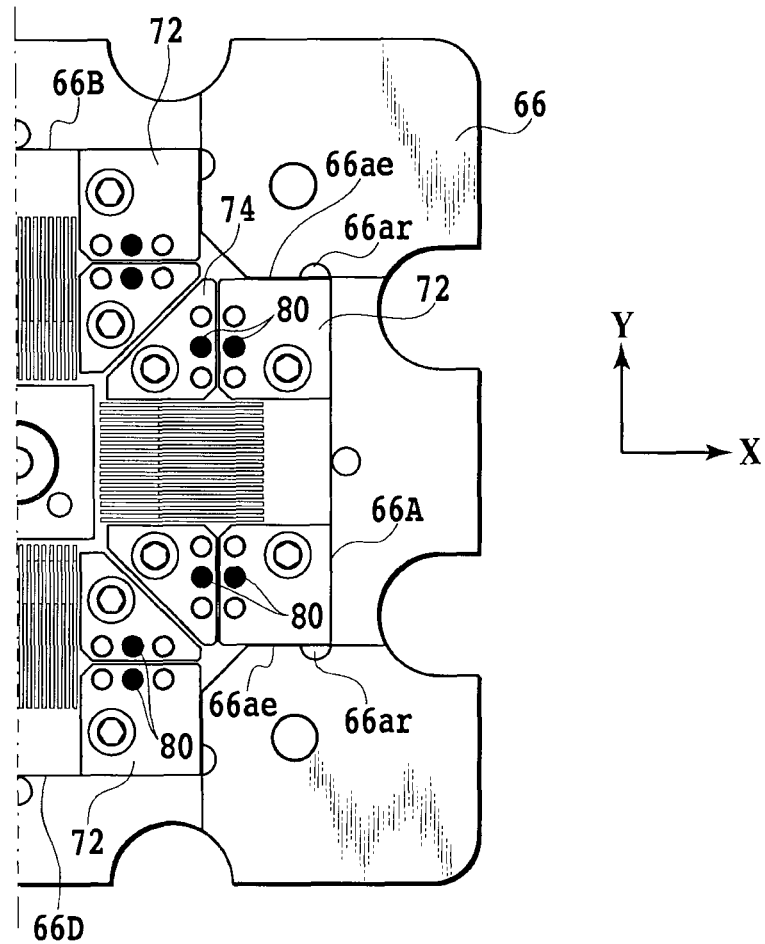
FIG. 21 is a plan view showing a contact block housing member in the third embodiment of the semiconductor device socket according to the present invention together with contact blocks.
Figure 22A:
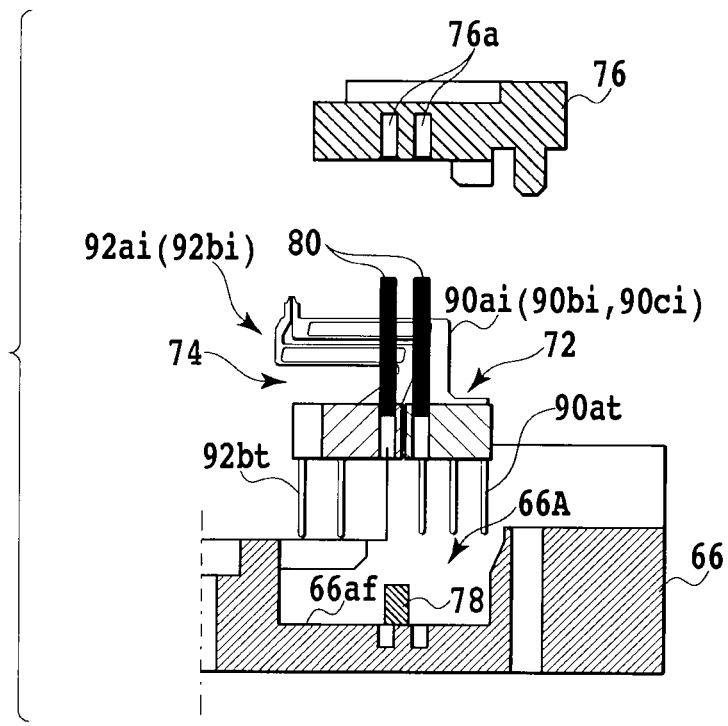
FIG. 22A is a partial cross-sectional view made available for explanation of assembly procedures for the example shown in FIG. 20.

The contact block housing member 66 has a semiconductor device mounting stage 30 which is located at the central part. As shown in FIG. 21, contact block accommodation portions 66A, 66B, 66C (not shown), and 66D are formed substantially in a crisscross shape around the semiconductor device mounting stage 30 at an interval of 90° along a circumferential direction. The contact block accommodation portions 66A, 66B, 66C, and 66D communicate with one another, and the contact blocks 72 and 74 to be described later are detachably housed therein as shown in FIG. 22A. Since the contact block accommodation portions 66A to 66D have the same structure, the contract block accommodation portion 66A will be described and explanation on the other contact block accommodation portions 66B to 66D will be omitted.

As shown in FIG. 21, relief portions 66ar are formed to be opposed to each other in inner peripheral surfaces which form the contact block accommodation portion 66A. The relief portions 66ar are formed at portions where inner peripheral surfaces along a direction intersecting a coordinate axis Y of orthogonal coordinates X and Y shown in FIG. 21 (parallel to a coordinate axis X), i.e., in a direction substantially orthogonal to a direction of arrangement of the contact terminals to be described later, cross an inner peripheral surface along the coordinate axis Y. Each corner portion at an outer peripheral portion of the contact block 72 is inserted into each of the relief portions 66ar.

Positioning surfaces 66ae configured to position the outer peripheral portion of the contact block 72 are formed in the inner peripheral surfaces along the X coordinate axis in FIG. 21 continued to the respective relief portions 66ar described above.

As shown in FIG. 22A, a thin-plate elastic member 78 is fixed to a position corresponding to a boundary portion between the contact block 72 and the contact block 74 to be described later at a bottom portion that forms the contact block accommodation portion 66A. The elastic member 78 is adapted to use its elastic force to bias the attached contact blocks 72 and 74 in directions of separating them from each other. Moreover, without limitation to the foregoing example, the elastic member 78 may be sandwiched between the contact block 72 and the contact block 74 and movably arranged with respect to the bottom portion that forms the contact block accommodation portion 66A, for instance.

Note that the contact block accommodation portions 66B and 66D are similarly provided with elastic members 78. A recess in the unillustrated contact block accommodation portion 66C is also provided with a similar elastic member 78.

As shown in FIG. 20, openings 66ah1 and 66ah2 are formed at a given interval in the bottom portion that forms the contact block accommodation portion 66A. A group of fixation terminals of contact terminals 90ai, 90bi, and 90ci of the contact block 72 and contact terminals 92ai and 92bi of the contact block 74 to be described later penetrate the openings 66ah1 and 66ah2. The openings 66ah1 and 66ah2 extend in the direction along the above-mentioned coordinate axis Y.

Figure 25:
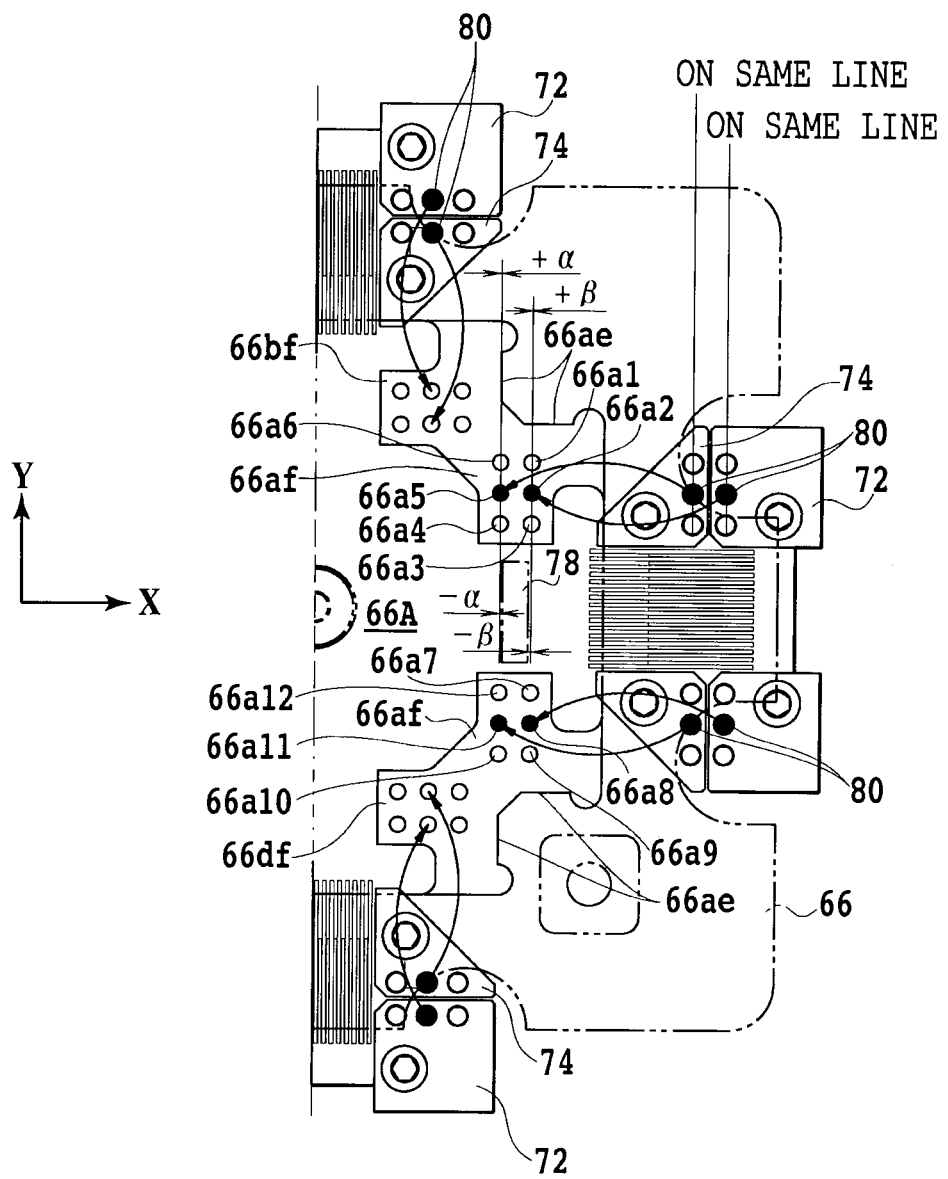
FIG. 25 is a view made available for explanation of position adjustment of the contact block shown in FIG. 20.

Mounting surfaces 66af for putting on a lower end portion of the contact block 72 are respectively formed in an inner surface of the bottom portion forming the contact block accommodation portion 66A in positions near both ends of the opening 66ah1 as shown in FIG. 25. One of the mounting surfaces 66af is formed in a spreading manner so as to border the inner peripheral surface forming the contact block accommodation portion 66A and an inner peripheral surface forming the adjacent contact block accommodation portion 66B. The other mounting surface 66af is formed in a spreading manner so as to border the inner peripheral surface forming the contact block accommodation portion 66A and an inner peripheral surface forming the adjacent contact block accommodation portion 66D.

Three through-holes 66a1, 66a2, and 66a3 constituting part of position adjusting means for the contact block are formed in one of the mounting surfaces 66af of the contact block accommodation portion 66A at equal intervals on a common first straight line that is inclined to the right at a given angle with respect to the coordinate axis Y in FIG. 25. Meanwhile, three through-holes 66a4, 66a5, and 66a6 constituting part of the position adjusting means for the contact block are formed at equal intervals on a common second straight line, which is substantially parallel to the above-described first straight line and is located closer by a given distance to the opening 66ah2.

Figure 27:
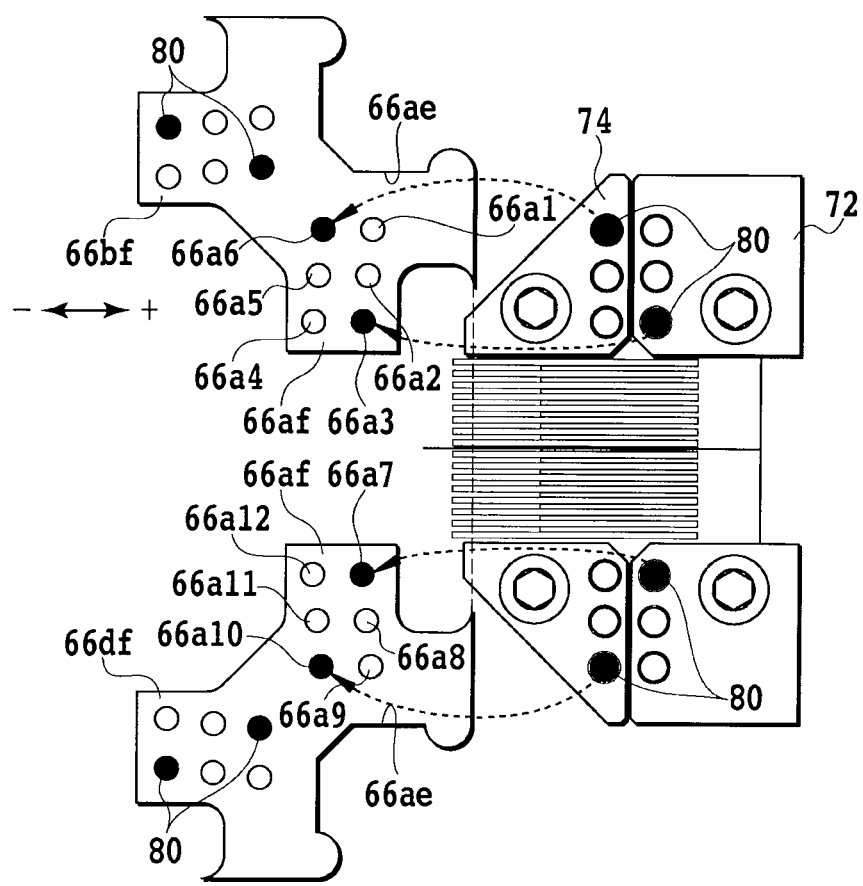
FIG. 27 is an enlarged view made available for explanation of the position adjustment of the contact block shown in FIG. 20.

In this case, as shown in an exaggerated manner in FIG. 27, a center position of the through-hole 66a1 is offset in a direction separating from the semiconductor device mounting stage 30 by a given value+β with respect to a center line of the through-hole 66a2 that is parallel to the Y coordinate axis. Meanwhile, as shown in an exaggerated manner in FIG. 27, a center position of the through-hole 66a3 is offset in a direction approaching the semiconductor device mounting stage 30 by a given value −β with respect to the center line of the through-hole 66a2 that is parallel to the Y coordinate axis. That is, the through-holes 66a1 and 66a3 are offset in a position adjustment direction to be described later.

As shown in an exaggerated manner in FIG. 27, a center position of the through-hole 66a6 is offset in a direction separating from the semiconductor device mounting stage 30 by a given value+α with respect to a center line of the through-hole 66a5 that is parallel to the Y coordinate axis. Meanwhile, as shown in an exaggerated manner in FIG. 27, a center position of the through-hole 66a4 is offset in a direction approaching the semiconductor device mounting stage 30 by a given value −α with respect to the center line of the through-hole 66a5 that is parallel to the Y coordinate axis. That is, the through-holes 66a6 and 66a4 are offset in the position adjustment direction to be described later.

In the meantime, three through-holes 66a7, 66a8, and 66a9 constituting part of the position adjusting means for the contact block are formed on the other mounting surface 66af of the contact block accommodation portion 66A at equal intervals on a common third straight line that is inclined to the left at a given angle with respect to the coordinate axis Y in FIG. 25. Meanwhile, three through-holes 66a10, 66a11, and 66a12 constituting part of the position adjusting means for the contact block are formed at equal intervals on a common fourth straight line, which is substantially parallel to the above-described third straight line and is located closer by a given distance to the opening 66ah2.

In this case, as shown in an exaggerated manner in FIG. 27, a center position of the through-hole 66a7 is offset in the direction approaching the semiconductor device mounting stage 30 by the given value −β with respect to a center line of the through-hole 66a8 that is parallel to the Y coordinate axis. Meanwhile, as shown in an exaggerated manner in FIG. 27, a center position of the through-hole 66a9 is offset in the direction separating from the semiconductor device mounting stage 30 by a given value+β with respect to the center line of the through-hole 66a8 that is parallel to the Y coordinate axis.

As shown in an exaggerated manner in FIG. 27, a center position of the through-hole 66a12 is offset in the direction approaching the semiconductor device mounting stage 30 by the given value −α with respect to a center line of the through-hole 66a11 that is parallel to the Y coordinate axis. Meanwhile, as shown in an exaggerated manner in FIG. 27, a center position of the through-hole 66a10 is offset in the direction separating from the semiconductor device mounting stage 30 by the given value+α with respect to the center line of the through-hole 66a11 that is parallel to the Y coordinate axis.

In the meantime, multiple through-holes constituting part of position adjusting means for the contact blocks are formed in two mutually parallel rows in each of mounting surfaces 66bf and 66df in the contact block accommodation portions 66B and 66D as shown in FIG. 25. Common straight lines in the respective rows in the mounting surface 66bf are inclined upward to the right at a given angle with respect to the coordinate axis X. The through-holes in each row are formed at equal intervals.

Common straight lines in the respective rows in the mounting surface 66df are inclined upward to the left at a given angle with respect to the coordinate axis X in FIG. 25. The through-holes in each row are formed at equal intervals.

Sizes, mutual distances, and positions of the thorough-holes 66a1 to 66a3 and 66a7 to 66a9 are set corresponding to positions of through-holes in the contact block 72 to be described later. Meanwhile, sizes, mutual distances, and positions of the thorough-holes 66a4 to 66a6 and 66a10 to 66a12 are set corresponding to through-holes in the contact block 74 to be described later.

Positioning pins 80 for positioning the contact block 72 with respect to the contact block accommodation portion are selectively inserted to two through-holes out of the through-holes 66a1 to 66a3 and 66a7 to 66a9, respectively. Meanwhile, positioning pins 80 for positioning the contact block 74 with respect to the contact block accommodation portion are selectively inserted to two through-holes out of the through-holes 66a4 to 66a6 and 66a10 to 66a12, respectively.

As shown in FIG. 24A to FIG. 24D, the contact block 72 includes the contact terminals $90ai$, $90bi$, and $90ci$ (i=1 to n, n is a positive integer) which are formed by using a thin-plate metal material, and a contact holder which holds the contact terminals $90ai$ to $90ci$.

The three types of contact terminals $90ai$, $90bi$, and $90ci$ have the same structure except for positions of respective fixation terminal portions 90at at ends of joining portions. Accordingly, the contact terminal $90ai$ will be described and explanation on the other contact terminals $90bi$ and $90ci$ will be omitted.

The contact terminal $90ai$ is formed by press work and is provided with a movable piece portion 90ac having a contact portion at one end which comes into contact with one terminal (electrode) of a semiconductor device DV, a fixation terminal portion 90at which is fixed to a printed wiring board 2 with solder, and a joining portion 90af which joins the movable piece portion and the fixation terminal portion 90at.

The elastically deformable movable piece portion includes a slit 90ah at its central part. The other end of the movable piece portion 90ac is bent and integrally coupled with one of end portions of the joining portion. The joining portion 90af is formed substantially into a gate shape. Thus the movable piece portion 90ac extends substantially parallel to the one of the end portions of the joining portion 90af.

The fixation terminal portion 90at is integrally formed in such a manner as to be perpendicular to the other end portion of the joining portion 90af. Meanwhile, in the contact terminal $90bi$, a coupling position of the fixation terminal portion 90at with the joining portion 90af is offset toward the left with respect to a right end of the joining portion 90af in FIG. 20 as compared to the contact terminal $90ai$. In the contact terminal $90ci$, a coupling position of the fixation terminal portion $90at$ with the joining portion is located most distant from the right end of the joining portion.

The contact holder for holding the contact terminals $90ai$ to $90ci$ is made of a resin material, for example, and includes a contact holding portion 72B to which the contact terminals $90ai$ to $90ci$ are inserted, and fixation end portions 72A and 72C which are integrally formed on both sides of the contact holding portion 72B as shown in the enlarged view of FIG. 24A to FIG. 24D.

As shown in FIG. 24A and FIG. 24B, the contact holding portion 72B includes slit portions $72Si$ (i=1 to n, n is a positive integer) provided at given intervals in an outer peripheral portion of a rectangular cross section. The joining portions of the contact terminals $90ai$ to $90ci$ are respectively inserted into the slit portions $72Si$. The adjacent slit portions $72Si$ are partitioned by partition walls $72Wi$ (i=1 to n, n is a positive integer).

When the contact block 72 is attached to the contact block accommodation portions 66A and 66C, for example, the slit portions $72Si$ are formed such that the contact portions of the contact terminals $90ai$ to $90ci$ are arranged along the coordinate axis Y in FIG. 21.

The fixation end portions 72A and 72C are respectively supported by and fixed to the mounting surfaces $66af$ of the contact block accommodation portion 66A described above. As shown in FIG. 24A, through-holes $72at$ constituting part of the position adjusting means for the contact block are formed in three positions in each of the fixation end portions 72A and 72C at equal intervals on a common straight line that is substantially parallel to a long side.

The fixation end portions 72A and 72C are respectively supported by and fixed to the mounting surfaces $66af$ of the contact block accommodation portion 66A described above. In this case, as shown in FIG. 21, ends of the positioning pins are selectively inserted so as to be inserted to one through-hole out of the through-holes $66a1$ to $66a3$ and to one through-hole out of the through-holes $66a7$ to $66a9$ described above via two through-holes $72at$ out of the six through-holes $72at$.

As shown in FIG. 24A, through-holes $72b$ are respectively formed at portions of the fixation end portions 72A and 72C located on both sides of the contact holding portion 72B in such a manner as to face the rows of through-holes $72at$ described above. Unillustrated machine screws are inserted to the through-holes $72b$.

As shown in FIG. 23A to FIG. 23D, the contact block 74 includes the contact terminals $92ai$ and $92bi$ (i=1 to n, n is a positive integer) which are formed by using a thin-plate metal material, and a contact holder which holds the contact terminals $92ai$ and $92bi$.

The two types of contact terminals $92ai$ and $92bi$ have the same structure except for positions of respective fixation terminal portions $92bt$ at ends of joining portions. Accordingly, the contact terminal $92ai$ will be described and explanation on the other contact terminal $92bi$ will be omitted.

As shown in FIG. 20, the contact terminal $92ai$ is formed by press work and is provided with a movable piece portion $92ac$ having a contact portion at one end which comes into contact with the one terminal (electrode) of the semiconductor device DV at a given distance away from the contact portion of the contact terminal $90ai$ that comes into contact in common, a fixation terminal portion $92bt$ which is fixed to the printed wiring board 2 with solder, and the joining portion $92af$ which joins the movable piece portion and the fixation terminal portion $92bt$.

The elastically deformable movable piece portion $92ac$ includes a slit $92ah$ at its central part. The other end of the movable piece portion $92ac$ is bent and integrally coupled with one of end portions of the joining portion $92af$. The joining portion $92af$ is formed substantially into a gate shape. The joining portion $92af$ is formed in such a manner as to be cut open in a reverse direction to a direction of cutting open the joining portion of the contact terminal $90ai$. Thus the movable piece portion $92ac$ extends substantially parallel to the one of the end portions of the joining portion.

The fixation terminal portion $92at$ is integrally formed in such a manner as to be perpendicular to the other end portion of the joining portion $92af$. Meanwhile, in the contact terminal $92bi$, a coupling position of the fixation terminal portion $92bt$ with the joining portion is offset toward the right at a given distance with respect to a left end of the joining portion in FIG. 22A as compared to the contact terminal $92ai$.

Accordingly, the movable piece portions of the contact terminal $90ai$ and the contact terminal $92ai$ form a so-called Kelvin contact.

The contact holder is made of a resin material, for example, and includes a contact holding portion 74B to which the contact terminals $92ai$ and $92bi$ are inserted, and fixation end portions 74A and 74C which are integrally formed on both sides of the contact holding portion 74B as shown in the enlarged view of FIG. 23A to FIG. 23D.

Figures 23A, 23B:
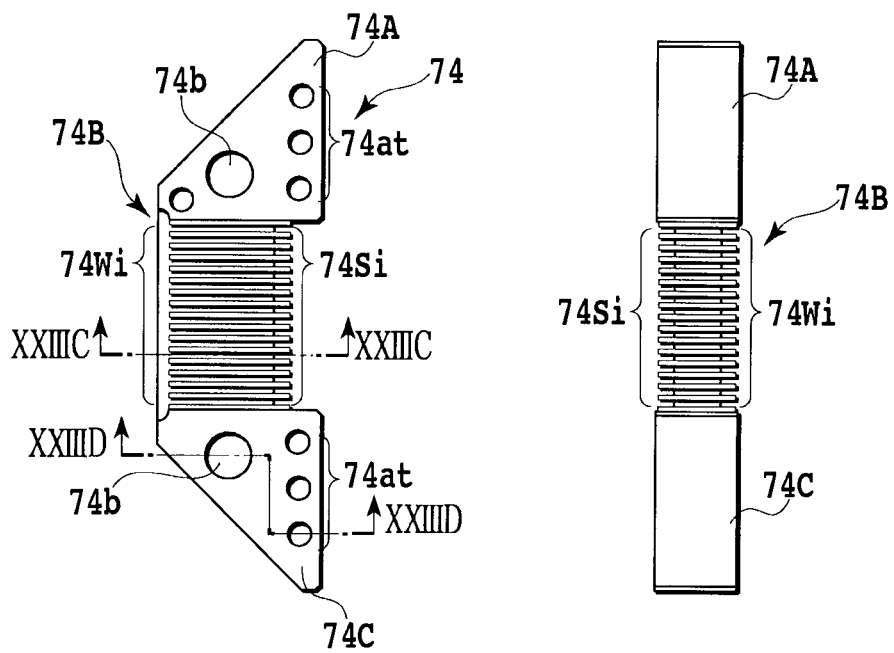
FIG. 23A is a plan view illustrating a contact holder constituting part of the contact block shown in FIG. 20.
FIG. 23B is a side view of the view shown in FIG. 23A.
Figure 23C:
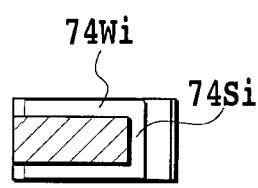
FIG. 23C is a cross-sectional view taken along the XXIIIC-XXIIIC line shown in FIG. 23A.
Figure 23D:
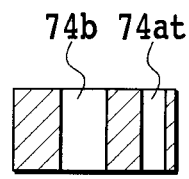
FIG. 23D is a cross-sectional view taken along the XXIIID-XXIIID line shown in FIG. 23A.

As shown in FIG. 23A to FIG. 23C, the contact holding portion 74B includes slit portions $74Si$ (i=1 to n, n is a positive integer) provided at given intervals. The joining portions of the contact terminals $92ai$ and $92bi$ are respectively inserted into the slit portions $74Si$. The adjacent slit portions $74Si$ are partitioned by partition walls $74Wi$ (i=1 to n, n is a positive integer).

When the contact block 74 is attached to the contact block accommodation portions 66A and 66C, for example, the slit portions $74Si$ are formed corresponding to the slit portions $72S1$ of the contact holding portion 72B of the contact block 72 described above.

The fixation end portions 74A and 74C are respectively supported by and fixed to the mounting surfaces $66af$ of the contact block accommodation portion 66A described above. As shown in FIG. 23A, through-holes $74at$ constituting part of the position adjusting means for the contact block are formed in three positions in each of the fixation end portions 74A and 74C at equal intervals on a common straight line that is substantially parallel to a long side.

In that case, as shown in FIG. 21, ends of the positioning pins 80 are selectively inserted so as to be inserted to one through-hole out of the through-holes $66a4$ to $66a6$ and to one through-hole out of the through-holes $66a10$ to $66a12$ described above via two through-holes $74at$ out of the six through-holes $74at$.

As shown in FIG. 23A, through-holes $74b$ are respectively formed at portions of the fixation end portions 74A and 74C located on both sides of the contact holding portion 74B in such a manner as to face the rows of through-holes $74at$ described above. Unillustrated machine screws are inserted to the through-holes $74b$.

Figure 26A:
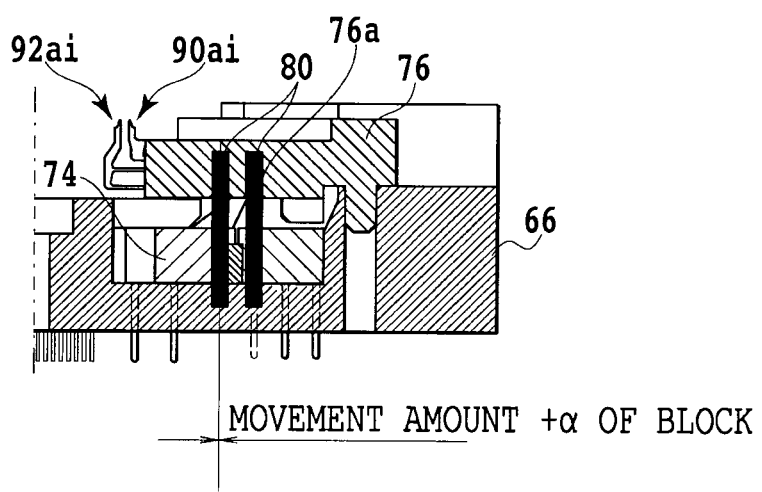
FIG. 26A is a view made available for explanation of the position adjustment of the contact block shown in FIG. 20.

As a consequence, as shown in FIG. 21, the machine screws are respectively inserted to the through-holes $72b$ and $74b$ of the contact blocks 72 and 74. Thereafter, the machine screws are screwed into female screw holes (not shown) formed in the respective contact block accommodation portions, for example. Thus the contact blocks 72 and 74 are fixed into the respective contact block accommodation portions. Then, the adapter plate 76 is placed on an upper end surface of the contact block housing member 66 as shown in FIG. 26A.

In this case, the ends of the two positioning pins 80 are respectively inserted into holes 76*a* formed in a lower end surface of the adapter plate 76.

In this configuration, regarding the contact blocks 72 and 74, the ends of the two positioning pins 80 are assumed to have been inserted to the through-holes 66*a*2, 66*a*8, 66*a*5, and 66*a*11 located second from the ends of the contact block accommodation portion 66A via the through-holes 72*at* and 74*at* located second from the ends of the contact holder as shown in FIG. 25, for example. In that case, relative positions of the contact terminals 90*ai* to 90*ci* in the contact block 72 and the contact terminals 92*ai* and 92*bi* in the contact block 74 with respect to the terminals of the semiconductor device DV are adjusted as described below.

First, the relative positions of the contact portions of the contact terminals 90*ai* to 90*ci* in the contact block 72 and the contact terminals 92*ai* and 92*bi* in the contact block 74 with respect to the terminals of the semiconductor device DV are adjusted so as to move closer to the semiconductor device mounting stage 30 by a given value A ($=\alpha+\beta$) without changing distances between the contact portions of the contact terminals 90*ai* to 90*ci* and the contact portions of the contact terminals 92*ai* and 92*bi*. At this time, the contact blocks 72 and 74 are once detached from the contact block accommodation portion 66A. Then, as shown in FIG. 22A the positioning pins 80 are pulled out of the contact blocks 72 and 74. Next, the ends of the positioning pins 80 are inserted again to the through-holes 66*a*3, 66*a*7, 66*a*4, and 66*a*12 via the two through-holes 72*at* and 74*at* in the contact blocks 72 and 74, the through-holes being located closest to the slits in the contact holder.

Accordingly, since the center positions of the through-holes 66*a*3 and 66*a*7 are respectively separated from the straight line parallel to the Y coordinate axis line that includes the center lines of the adjacent through-holes 66*a*2 and 66*a*8 by the value ($-\beta$) toward the semiconductor device mounting stage 30, the entire contact block 72 is brought closer to the semiconductor device mounting stage 30 by the value $\beta$. Meanwhile, since the center positions of 66*a*4 and 66*a*12 are respectively separated from the straight line parallel to the Y coordinate axis line that includes the center lines of the adjacent through-holes 66*a*5 and 66*a*11 by the value ($-\alpha$) toward the semiconductor device mounting stage 30, the entire contact block 74 is brought closer to the semiconductor device mounting stage 30 by the value $\alpha$. As a consequence, the relative positions of the contact portions of the contact terminals 90*ai* to 90*ci* in the contact block 72 and the contact terminals 92*ai* and 92*bi* in the contact block 74 with respect to the terminals of the semiconductor device DV are adjusted so as to move closer to the semiconductor device mounting stage 30 by the given value A ($=-(\alpha+\beta)$). Here, the above-mentioned values $\alpha$ and $\beta$ may be equal to each other or may be different from each other as if there is a magnitude relation.

In the meantime, an assumption will be made that the relative positions of the contact portions of the contact terminals 90*ai* to 90*ci* in the contact block 72 and the contact terminals 92*ai* and 92*bi* in the contact block 74 are adjusted with respect to the terminals of the semiconductor device DV so as to move away from the semiconductor device mounting stage 30 by a given value A' ($=\alpha+\beta$) without changing the distances between the contact portions of the contact terminals 90*ai* to 90*ci* and the contact portions of the contact terminals 92*ai* and 92*bi*. In this case, the positioning pins 80 are pulled out of the contact blocks 72 and 74. Next, the ends of the positioning pins 80 are inserted again to the through-holes 66*a*1, 66*a*9, 66*a*6, and 66*a*10 via the two through-holes 72*at* and 74*at* on the contact blocks 72 and 74, the through-holes being located farthest from the slits in the contact holder.

Figure 26B:
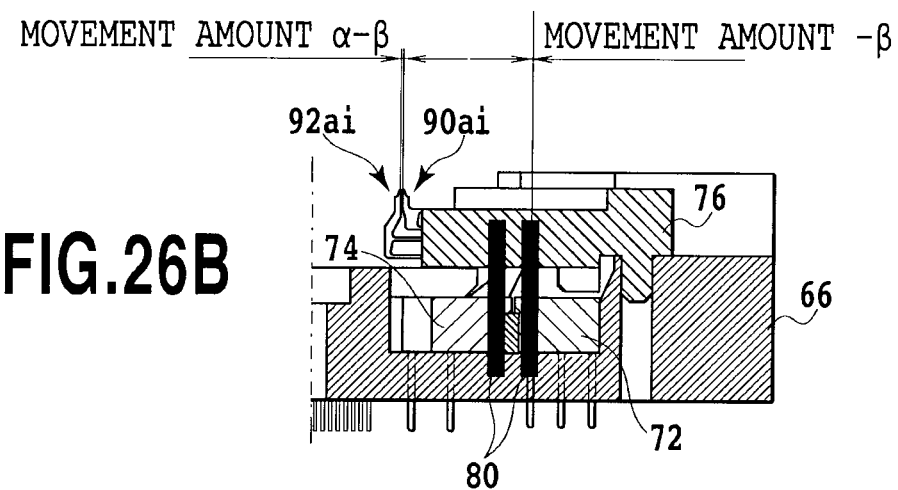
FIG. 26B is a view made available for explanation of the position adjustment of the contact block shown in FIG. 20.

In addition, according to this example, the distances between the contact portions of the contact terminals 90*ai* to 90*ci* and the contact portions of the contact terminals 92*ai* and 92*bi* can be adjusted. For example, the mutual distance between the contact portion of the contact terminal 90*ai* and the contact portion of the contact terminal 92*ai* is changed to be smaller from a state shown in FIG. 26A to a state shown in FIG. 26B. In this case, the contact blocks 72 and 74 are once detached from the contact block accommodation portion 66A. Then, the positioning pins 80 are pulled out of the contact blocks 72 and 74. Next, as shown in the enlarged view of FIG. 27, the ends of the positioning pins 80 are inserted again to the through-holes 66*a*3 and 66*a*7 via the two through-holes 72*at* in the contact block 72, the through-holes being located closest to the slits in the contact holder. Meanwhile, the ends of the positioning pins 80 are inserted into the through-holes 66*a*6 and 66*a*10 via the two through-holes 74*at* in the contact block 74, the through-holes being located farthest from the slits in the contact holder.

Accordingly, since the center positions of the through-holes 66*a*3 and 66*a*7 are respectively offset toward the semiconductor device mounting stage 30 by the value ($-\beta$) with respect to the straight line parallel to the Y coordinate axis line that includes the center lines of the adjacent through-holes 66*a*2 and 66*a*8, the entire contact block 72 is brought closer to the semiconductor device mounting stage 30 by the value $\beta$. Meanwhile, since the center positions of the through-holes 66*a*6 and 66*a*10 are respectively offset in the direction separating from the semiconductor device mounting stage 30 by the value ($+\alpha$) with respect to the straight line parallel to the Y coordinate axis line that includes the center lines of the adjacent through-holes 66*a*5 and 66*a*11, the entire contact block 74 is brought closer to the contact block 72 by the value $\alpha$ in the direction separating from the semiconductor device mounting stage 30. As a consequence, the relative distances among the contact portions of the contact terminals 90*ai* to 90*ci* in the contact block 72 and the contact portions of the contact terminals 92*ai* and 92*bi* in the contact block 74 are adjusted to be smaller by a given value B ($=\alpha-\beta$).

In addition, in the above-described example, the fixation terminal portions of the three types of contact terminals 90*ai* to 90*ci* in the contact block 72 and the two types of contact terminals 92*ai* and 92*bi* in the contact block 74 are fixed to the printed wiring board 2 with solder.

Figure 22B:
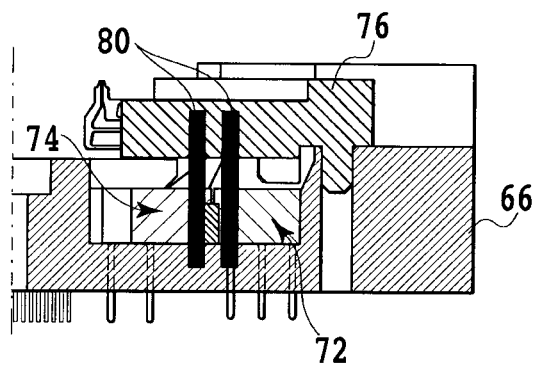
FIG. 22B is a partial cross-sectional view made available for explanation of the assembly procedures for the example shown in FIG. 20.
Figure 28:
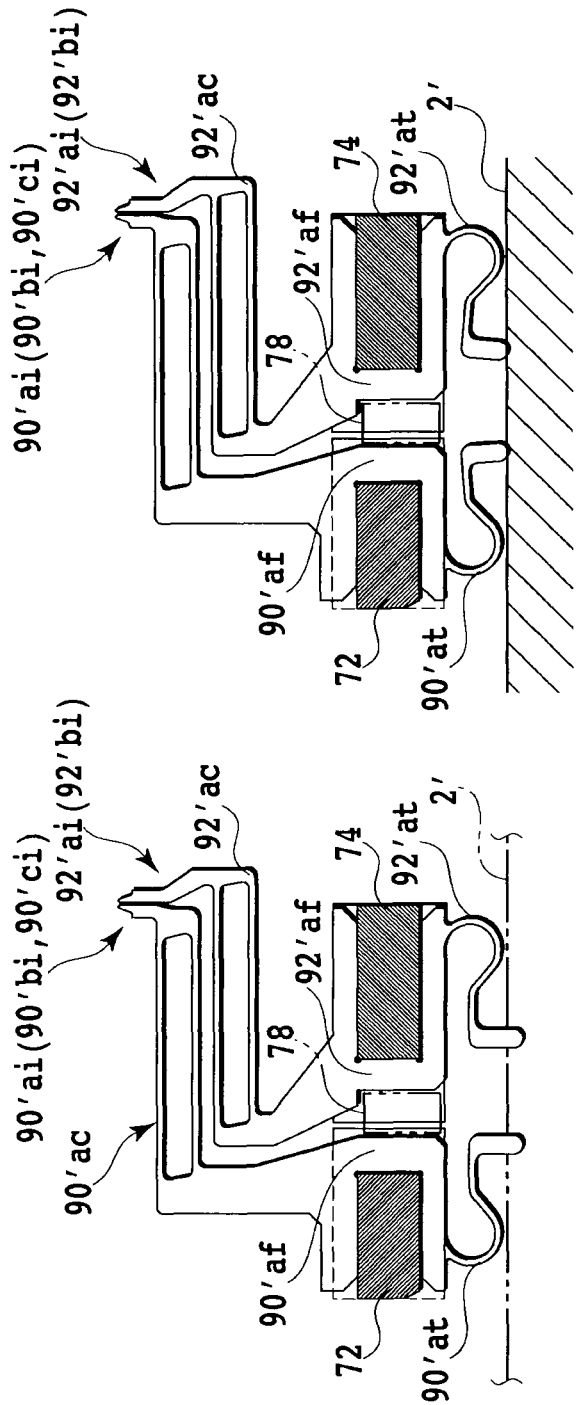
FIG. 28A is a cross-sectional view illustrating another example of the contact terminals in the contact block shown in FIG. 20.
FIG. 28B is a cross-sectional view showing the other example of the contact terminals in the contact block shown in FIG. 20.

However, without limitation to the foregoing example, each of fixation terminal portions of contact terminals 90'*ai* to 90'*ci* and contact terminals 92'*ai* and 92'*bi* may be provided with an elastic fixation terminal portion 90'*at* or 92'*at* in a curved shape as shown in the enlarged view of FIG. 28A, for instance. In FIG. 28A and FIG. 28B, the same constituents as those shown in FIG. 22A and FIG. 22B will be designated by the same reference numerals with primes (') added thereto and duplicate explanation thereof will be omitted.

The fixation terminal portions of the contact terminals 90'*ai* to 90'*ci* and of the contact terminals 92'*ai* and 92'*bi* are mounted on a printed wiring board 2' which is different from the printed wiring board 2. A group of prescribed contact pads to be conducted to an unillustrated electrically conductive layer inside the board are formed on a surface used for mounting.

The three types of contact terminals 90'*ai* to 90'*ci* have the same structure except for positions of the respective fixation terminal portions 90'*at* at ends of joining portions 90'*af*.

Accordingly, the contact terminal 90'*ai* will be described and explanation on the other contact terminals 90'*bi* and 90'*ci* will be omitted.

The contact terminal 90'*ai* is formed by press work and is provided with a movable piece portion 90'*ac* having a contact portion at one end which comes into contact with one terminal (electrode) of a semiconductor device DV, the fixation terminal portion 90'*at* which comes into contact with the contact pad on the printed wiring board 2' at a given pressure, and the joining portion 90'*af* which joins the movable piece portion 90'*ac* and the fixation terminal portion 90'*at*.

The fixation terminal portion 90'*at* in the curved shape is provided with a contact portion at one end which comes into contact with the contact pad, and is integrally formed in such a manner as to be perpendicular to the other end portion at the joining portion 90'*af*. Accordingly, when the contact block housing member to which the above-described contact block is attached is disposed on the printed wiring board 2', the fixation terminal portion 90'*at* is pressed and displaced in a state of contact of the contact portion with the contact pad as shown in FIG. 28B.

The two types of contact terminals 92'*ai* and 92'*bi* have the same structure except for positions of the respective fixation terminal portions 92'*at* at ends of joining portions 92'*af*. Accordingly, the contact terminal 92'*ai* will be described and explanation on the other contact terminal 92'*bi* will be omitted.

The contact terminal 92'*ai* is formed by press work and is provided with a movable piece portion 92'*ac* having a contact portion at one end which comes into contact with the one terminal (electrode) of the semiconductor device DV at a given distance away from the contact portion of the contact terminal 90'*ai* that comes into contact in common, the fixation terminal portion 92'*at* which comes into contact with the printed wiring board 2' at a given pressure, and the joining portion 92'*af* which joins the movable piece portion 92'*ac* and the fixation terminal portion 92'*at*.

The fixation terminal portion 92'*at* in the curved shape is integrally formed in such a manner as to be perpendicular to the other end portion at the joining portion 92'*af*. Accordingly, when the contact block housing member to which the contact block 74 having the above-described contact terminals is attached is disposed on the printed wiring board 2', the fixation terminal portion 92'*at* is pressed and displaced in a state of contact of the contact portion with the contact pad as shown in FIG. 28B.

Therefore, the above-described contact block also forms the so-called Kelvin contact by use of the movable piece portions of the contact terminal 90'*ai* and the contact terminal 92'*ai*.

Figure 29:
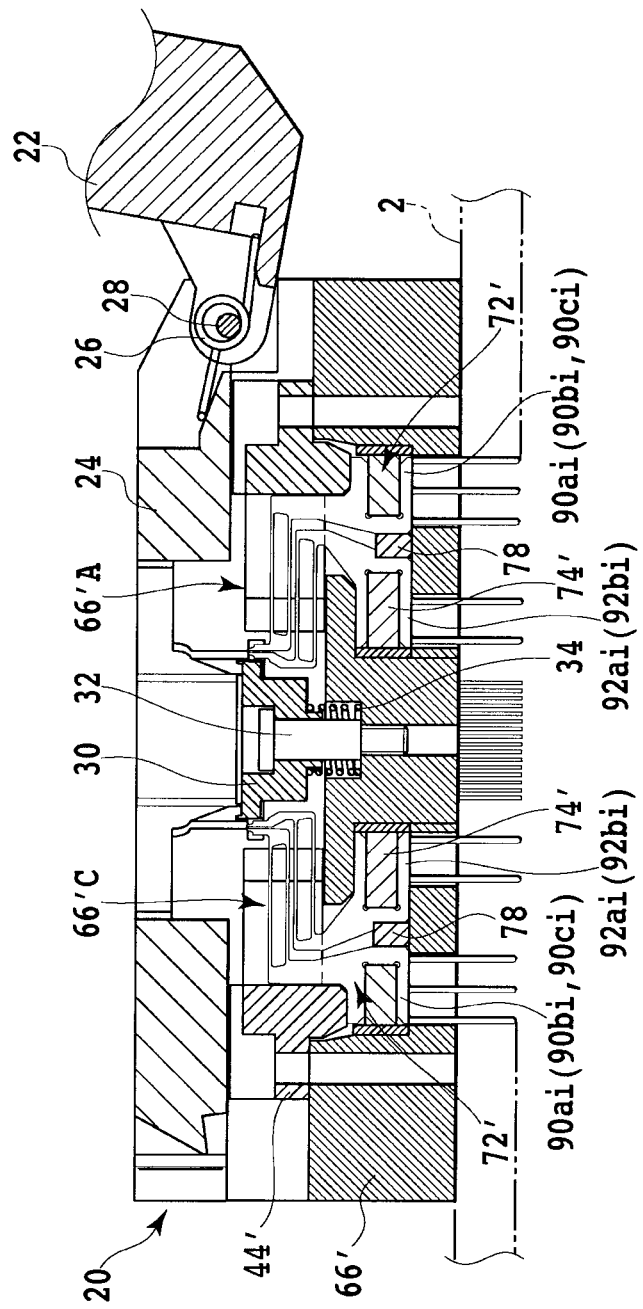
FIG. 29 is a cross-sectional view showing a fourth embodiment of a semiconductor device socket according to the present invention.

FIG. 29 shows a contact block housing member 66' in a fourth embodiment of a semiconductor device socket according to the present invention together with contact blocks 72' and 74' attached thereto.

Note that in FIG. 29 to FIG. 37A and FIG. 37B, the same constituents as those in the example shown in FIG. 20 will be designated by the same reference numerals as well as the same reference numerals with primes (') added thereto and duplicate explanation thereof will be omitted.

In this example as well, a pressing mechanism including a base member 24 and a lid member 22 is assumed to be fixed to an upper end surface of the contact block housing member 66' disposed on a printed wiring board 2 through an adapter plate 44'.

In the example shown in FIG. 20, the position adjusting means for the relative positions of the contact portions of the contact terminals 90*ai* to 90*ci* in the contact block 72 and the contact terminals 92*ai* and 92*bi* in the contact block 92 with respect to the terminals of the semiconductor device DV is formed by the positioning pins 80, the multiple through-holes 72*at* and 74*at* in the respective contact holders, and the multiple through-holes 66*a*1 to 66*a*12 in the contact block accommodation portions 66A to 66D. On the other hand, in the example shown in FIG. 29, the position adjusting means includes spacer members 94, 96, 98, and 100 (see FIG. 37B) having different thicknesses instead of the positioning pins 80 and the like.

Figure 31:
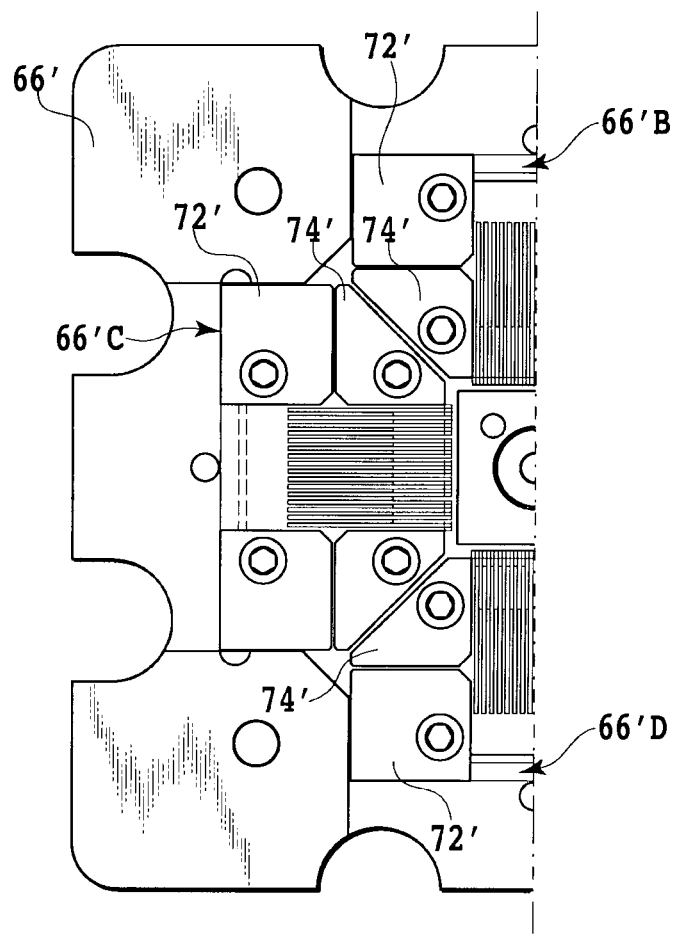
FIG. 31 is a plan view showing a contact block housing member in a fourth embodiment of the semiconductor device socket according to the present invention together with contact blocks.
Figure 32:
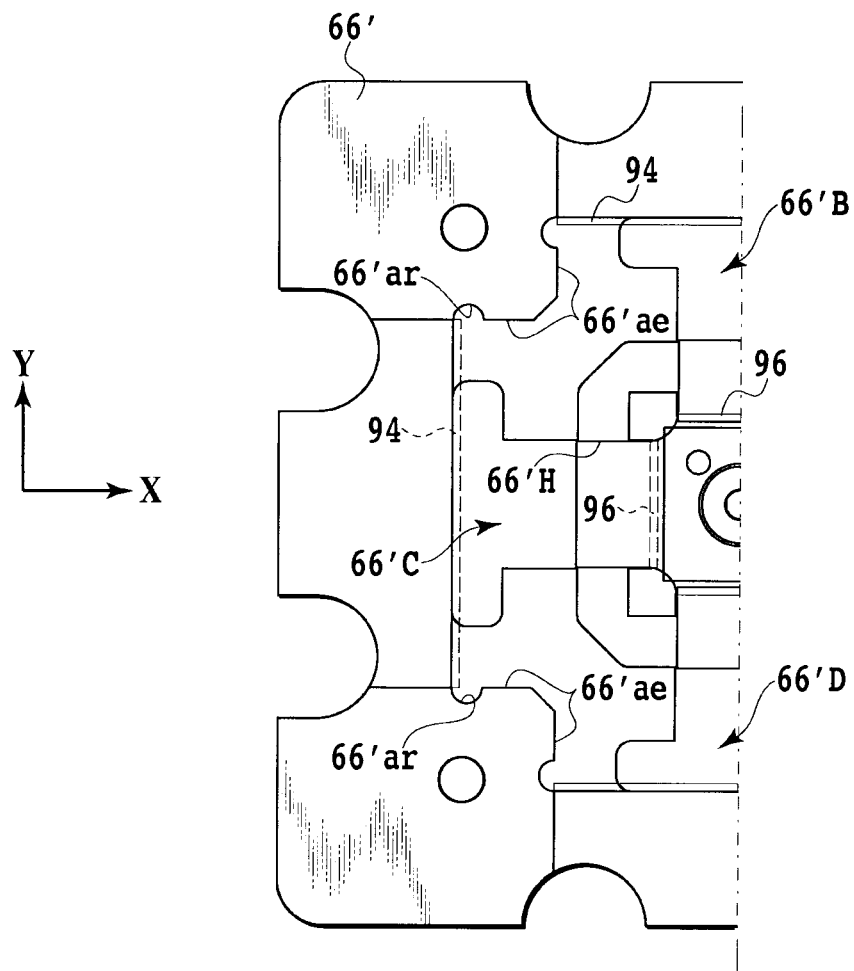
FIG. 32 is a plan view illustrating a state where the contact blocks in the example shown in FIG. 31 are detached.
Figure 33A:
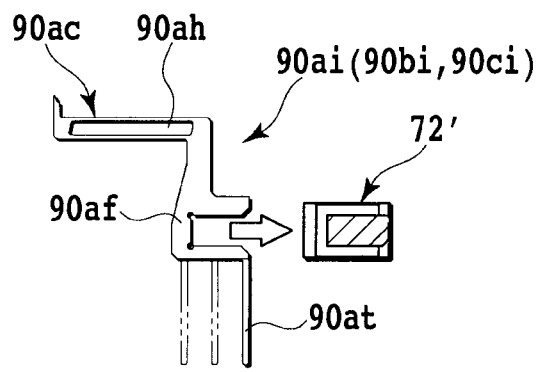
FIG. 33A is a view made available for explanation of assembly procedures for each contact block.
Figure 33B:
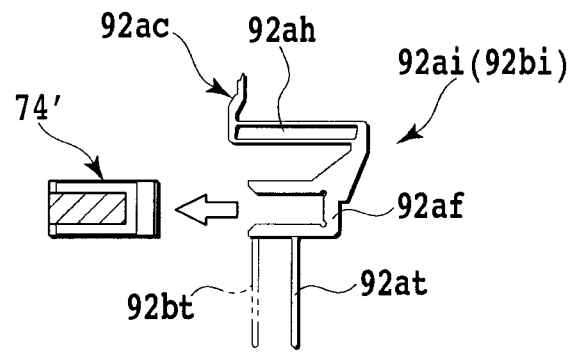
FIG. 33B is a view made available for explanation of assembly procedures for each contact block.
Figure 36A:
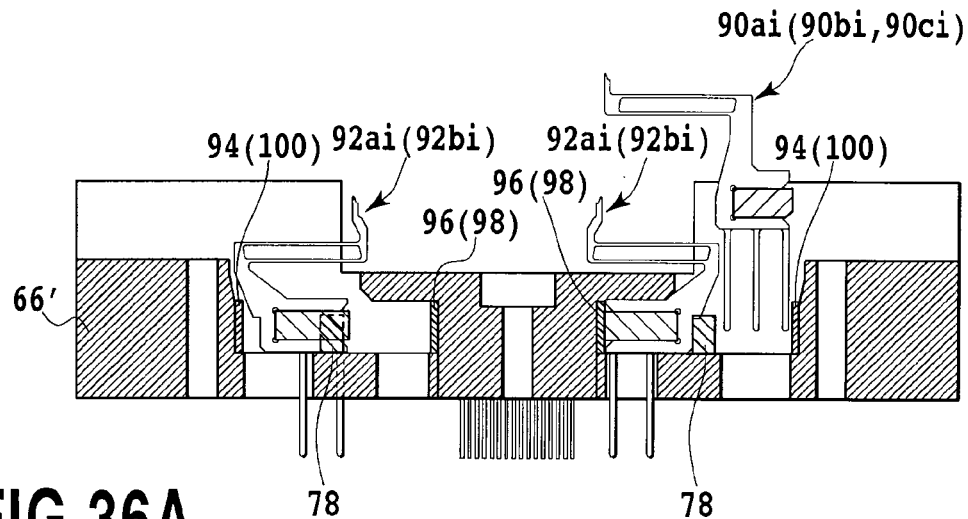
FIG. 36A is a cross-sectional view made available for explanation of procedures for attaching a contact block.
Figure 36B:
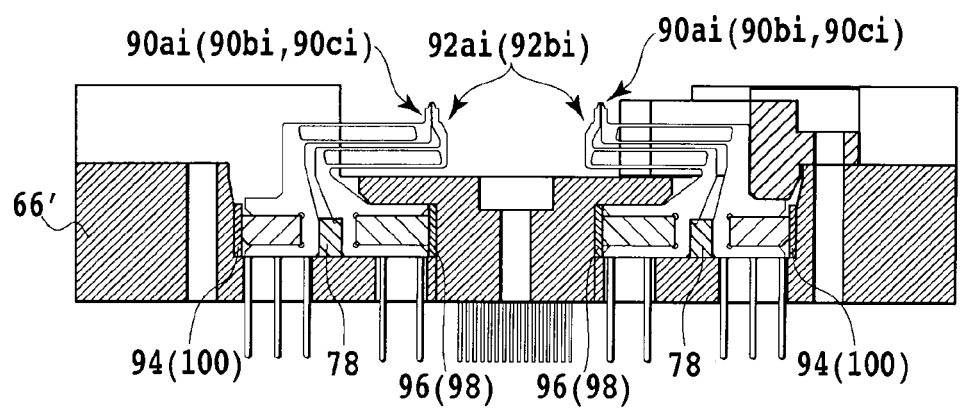
FIG. 36B is a cross-sectional view made available for explanation of the procedures for attaching the contact block.
Figure 36C:
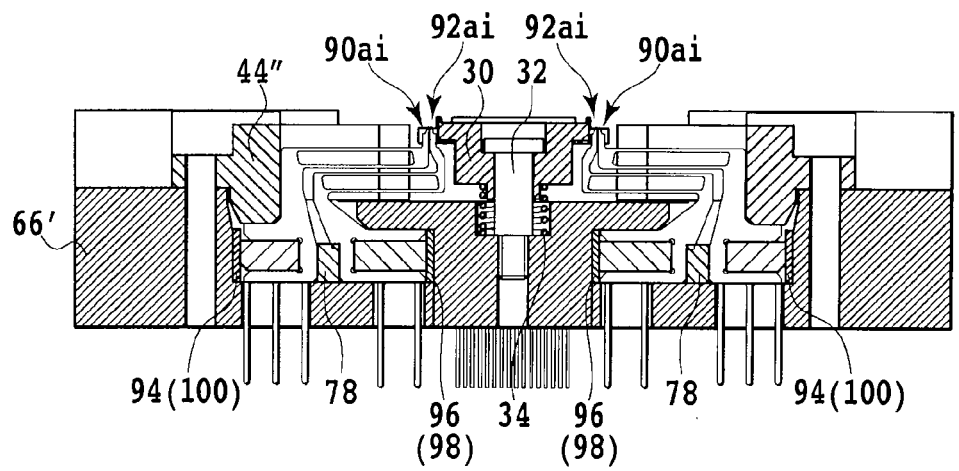
FIG. 36C is a cross-sectional view made available for explanation of the procedures for attaching the contact block.

In FIG. 29, FIG. 31, and FIG. 32, the contact block housing member 66' includes a semiconductor device mounting stage 30 at the central part. Contact block accommodation portions 66'A, 66'B, 66'C, and 66'D are formed substantially in a crisscross shape around the semiconductor device mounting stage 30 at an interval of 90° along a circumferential direction. The contact block accommodation portions 66'A, 66'B, 66'C, and 66'D communicate with one another, and contact blocks 72' and 74' to be described later are detachably housed therein as shown in FIGS. 36A to 36C. Since the contact block accommodation portions 66'A, 66'B, 66'C, and 66'D have the same structure, the contract block accommodation portion 66'C will be described and explanation on the other contact block accommodation portions 66'A to 66'D will be omitted.

Figure 30:
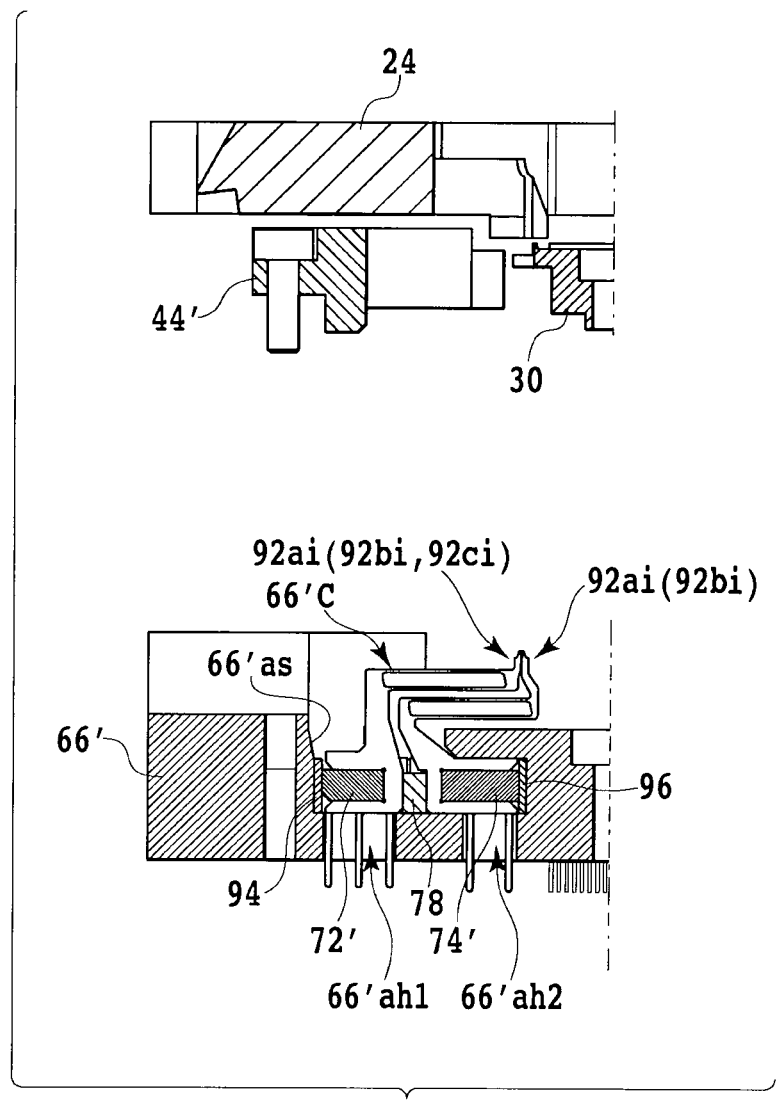
FIG. 30 is a cross-sectional view showing disassembly of the example shown in FIG. 29.

Relief portions 66'*ar* are formed to be opposed to each other in inner peripheral surfaces which form the contact block accommodation portion 66'C. The relief portions 66'*ar* are formed at portions where inner peripheral surfaces along a direction intersecting a coordinate axis Y of orthogonal coordinates X and Y shown in FIG. 32 (parallel to a coordinate axis X), i.e., in a direction substantially orthogonal to a direction of arrangement of the contact terminals, cross an inner peripheral surface along the coordinate axis Y. Each corner portion at an outer peripheral portion of the contact block 72' is inserted to each of the relief portions 66'*ar*. A recess 66'*as* is formed between the two relief portions 66'*ar*. The spacer member 94 constituting part of the position adjusting means comes into contact with a position below the recess 66'*as* in the inner peripheral surface as shown in FIG. 30. The spacer member 94 having a given plate thickness B is a thin-plate member which is made of a metal material, for example, and is provided with a surface finished at relatively high accuracy. Meanwhile, in the inner peripheral surface opposed to the spacer member 94, the spacer member 96 constituting part of the position adjusting means comes into contact with the inner peripheral surface. The spacer member 94 having a given plate thickness A is a thin-plate member which is made of a metal material, for example, and is provided with a surface finished at relatively high accuracy.

Positioning surfaces 66'*ae* configured to position an outer peripheral portion of a top stopper member 16 of the contact block 72' are formed in the inner peripheral surfaces along the X coordinate axis in FIG. 32 connected to the respective relief portions 66'*ar* described above.

A thin-plate elastic member 78 is provided in a position corresponding to a boundary portion between the contact block 72' and the contact block 74' at a bottom portion that forms the contact block accommodation portion 66'C. The elastic member 78 is designed to use its elastic force to bias the attached contact blocks 72' and 74' in directions of separating them from each other.

Note that the contact block accommodation portions 66'A, 66'B, and 66'D are also provided with elastic members 78 in similar positions.

As shown in FIG. 30, openings 66'*ah*1 and 66'*ah*2 are formed at a given interval in the bottom portion that forms the contact block accommodation portion 66'C. As shown in FIG. 30, a group of fixation terminals, namely, contact terminals 90*ai*, 90*bi*, and 90*ci* of the contact block 72' and a group of fixation terminals, namely, contact terminals 92*ai* and 92*bi* of the contact block 74' penetrate the openings 66'*ah*1 and 66'*ah*2. The openings 66'*ah*1 and 66'*ah*2 extend in the direction along the above-mentioned coordinate axis Y. Moreover, portions of the openings 66'*ah*1 and 66'*ah*2 communicate with each other through an opening 66'H.

Figure 35A:
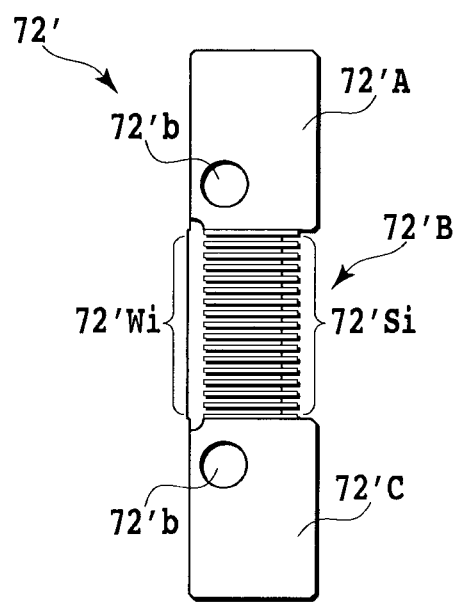
FIG. 35A is a plan view showing a contact holder of a contact block.
Figure 35B:
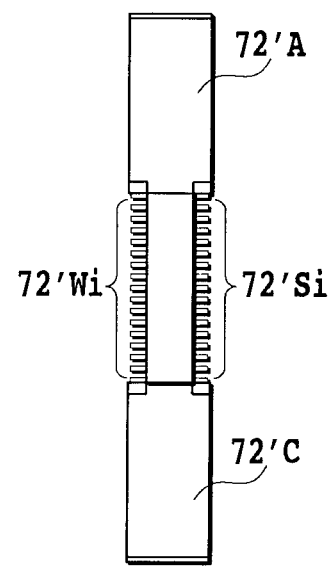
FIG. 35B is a side view of the view shown in FIG. 35A.

As shown in FIG. 35A and FIG. 35B, the contact block 72' has a structure similar to the structure of the above-described contact block 72 except for the through-holes 72*at*. The contact block 72' includes the contact terminals 90*ai* to 90*ci* and a contact holder which holds the contact terminals 90*ai* to 90*ci*.

The contact holder for holding the contact terminals 90*ai* to 90*ci* is made of a resin material, for example, and includes a contact holding portion 72'B to which the contact terminals 90*ai* to 90*ci* are inserted, and a pair of fixation end portions 72'A and 72'C which are integrally formed on both sides of the contact holding portion.

The contact holding portion 72'B includes slit portions 72'S$i$ ($i$=1 to n, n is a positive integer) provided at given intervals in an outer peripheral portion of a rectangular cross section. Joining portions 90*af* of the contact terminals 90*ai* to 90*ci* are respectively inserted into the slit portions 72'S$i$. The adjacent slit portions 72'S$i$ are partitioned by partition walls 72'W$i$ ($i$=1 to n, n is a positive integer).

When the contact block 72' is attached to the contact block accommodation portions 66'A and 66'C, for example, the slit portions 72'S$i$ are formed such that contact portions of the contact terminals 90*ai* to 90*ci* are arranged along the above-described coordinate axis Y.

The pair of fixation end portions 72'A and 72'C are respectively supported by and fixed to mounting surfaces of the contact block accommodation portion 66'C described above.

Through-holes 72'*b* are respectively formed in the pair of fixation end portions located on both sides of the contact holding portion. Unillustrated machine screws are inserted to the through-holes 72'*b*.

Figure 34A:
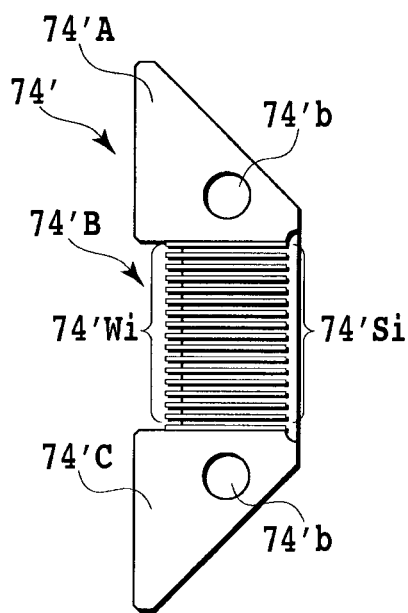
FIG. 34A is a plan view showing a contact holder of a contact block.
Figure 34B:
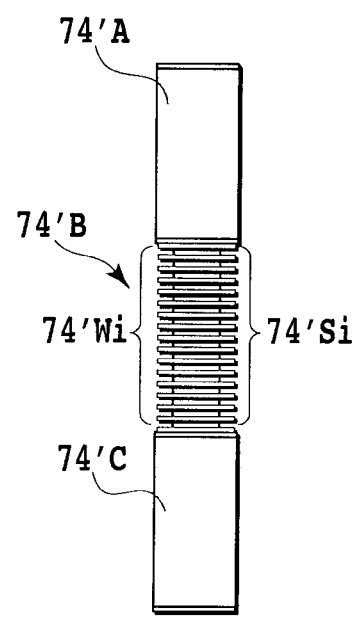
FIG. 34B is a side view of the view shown in FIG. 34A.

As shown in FIG. 34A and FIG. 34B, the contact block 74' has a structure similar to the structure of the above-described contact block 74 except for the through-holes 74*at*. The contact block 74' includes the contact terminals 92*ai* and 92*bi* and a contact holder which holds the contact terminals 92*ai* and 92*bi*.

The contact holder for holding the contact terminals 92*ai* and 92*bi* is made of a resin material, for example, and includes a contact holding portion 74'B to which the contact terminals 92*ai* and 92*bi* are inserted, and a pair of fixation end portions 74'A and 74'C which are integrally formed on both sides of the contact holding portion.

The contact holding portion 74'B includes slit portions 74'S$i$ ($i$=1 to n, n is a positive integer) provided at given intervals in an outer peripheral portion of a rectangular cross section. Joining portions 92*af* of the contact terminals 92*ai* and 92*bi* are respectively inserted into the slit portions 74'S$i$ (see FIG. 34B). The adjacent slit portions 74'S$i$ are partitioned by partition walls 74'W$i$ ($i$=1 to n, n is a positive integer).

When the contact block 74' is attached to the contact block accommodation portions 66'C and 66'A, for example, the slit portions 74'S$i$ are formed such that contact portions of the contact terminals 92*ai* and 92*bi* are arranged along the above-described coordinate axis Y.

The pair of fixation end portions 74'A and 74'C are respectively supported by and fixed to mounting surfaces of the contact block accommodation portion 66'C described above adjacent to the contact block 72' mentioned above.

Through-holes 74'*b* are respectively formed in the pair of fixation end portions located on both sides of the contact holding portion. Unillustrated machine screws are inserted to the through-holes 74'*b*.

Upon attachment of the contact blocks 72' and 74' to the contact block accommodation portions 66'A to 66'D, as shown in FIG. 36A to FIG. 36C, the contact block 74' is first attached into the contact block accommodation portions 66'A to 66'D, then moved toward a locating portion for the semiconductor device mounting stage 30 via the opening 66'H, and then brought into contact with the spacer member 96. Next, the contact block 72' is attached adjacent to the contact block 74' while interposing the elastic member 78 therebetween in such a manner that the contact portions of the contact terminals 90*ai* to 90*ci* are arranged parallel to the contact portions of the contact terminals 92*ai* and 92*bi*, and then brought into contact with the spacer member 94. Thereafter, an adapter plate 44" is placed on an upper end surface of the contact block housing member 66'. Here, the semiconductor device mounting stage 30 is attached to the contact block housing member 66'.

In this configuration, an assumption will be made that the relative positions of the contact portions of the contact terminals 90*ai* to 90*ci* in the contact block 72' and the contact terminals 92*ai* and 92*bi* in the contact block 74' are adjusted with respect to the terminals of the semiconductor device DV so as to move closer to the semiconductor device mounting stage 30 by a given value A without changing distances between the contact portions of the contact terminals 90*ai* to 90*ci* and the contact portions of the contact terminals 92*ai* and 92*bi*. In this case, the contact blocks 72' and 74' are once detached from the contact block accommodation portions 66'A and 66'C. Then the spacer member 96 is detached. Next, the contact blocks 72' and 74' are attached. Accordingly, the contact block 74' is brought into contact with the inner peripheral surface by an elastic force of the elastic member 78. As a consequence, the contact blocks 72' and 74' are adjusted so as to move closer to the semiconductor device mounting stage 30 by the given value A corresponding to the plate thickness of the spacer member 96.

Meanwhile, an assumption will be made that the relative positions of the contact portions of the contact terminals 90*ai* to 90*ci* in the contact block 72' and the contact terminals 92*ai* and 92*bi* in the contact block 74' are adjusted with respect to the terminals of the semiconductor device DV so as to move away from the semiconductor device mounting stage 30 by a given value B without changing the distances between the contact portions of the contact terminals 90*ai* to 90*ci* and the contact portions of the contact terminals 92*ai* and 92*bi*. At this time, the spacer member 94 is detached instead of the spacer member 96. Accordingly, the contact block 72' is brought into contact with the inner peripheral surface by the elastic force of the elastic member 78. As a consequence, the contact blocks 72' and 74' are adjusted so as to move away from the semiconductor device mounting stage 30 by the given value B corresponding to the plate thickness of the spacer member 94.

Figure 37A:
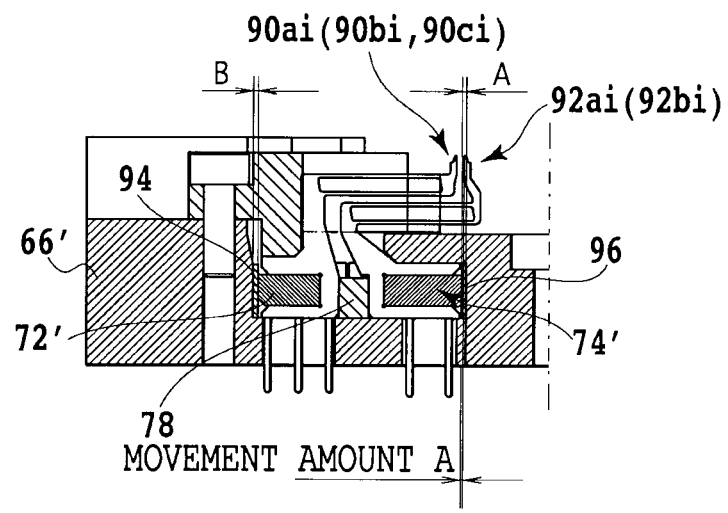
FIG. 37A is a cross-sectional view made available for explanation of position adjustment of a contact block.
Figure 37B:
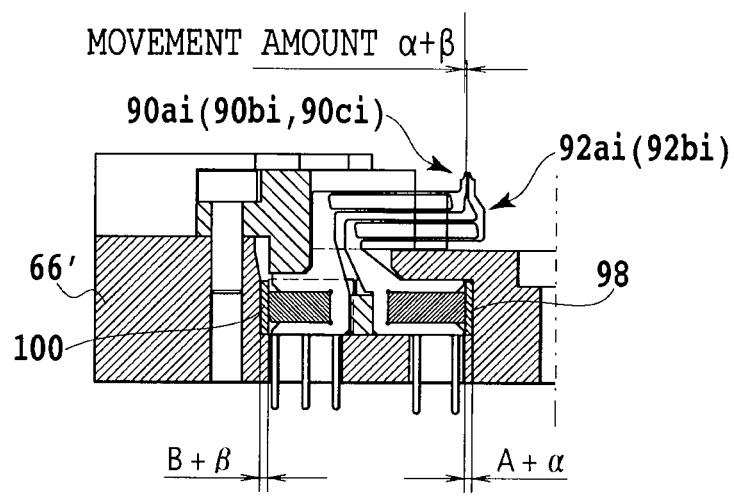
FIG. 37B is a cross-sectional view made available for explanation of the position adjustment of the contact block.

Furthermore, an assumption will be made that the distances between the contact portions of the contact terminals 90*ai* to 90*ci* and the contact portions of the contact terminals 92*ai* and 92*bi* are adjusted to be smaller by a given value C ($=\alpha+\beta$). In this case, the spacer member 100 having a plate thickness (B+$\beta$) and the spacer member 98 having a plate thickness (A+$\alpha$) are disposed as shown in FIG. 37B instead of the spacer members 94 and 96 in such a manner as to come into contact with the contact blocks 72' and 74'. Accordingly, the distances between the contact portions of the contact terminals 90ai to 90ci and the contact portions of the contact terminals 92ai and 92bi are reduced in the amount corresponding to the increase in the plate thicknesses of the spacer member 100 and the spacer member 98 because the contact blocks 72' and 74' move closer to each other against the elastic force of the elastic member 78.

In the above-described the first embodiment to the fourth embodiment, the semiconductor device socket is not necessarily limited to these examples and may adopt a type corresponding to a handler of a controlled conveyor robot (not shown) as the pressing mechanism 20 instead of the pressing mechanism of the clam shell type.

Moreover, the contact block is applied to the socket of the clam shell type in the above-described the first embodiment to the fourth embodiment. However, without limitation to these examples, the contact block can be applied to a different type of socket by being detachably provided to the socket.

REFERENCE SIGNS LIST

12, 12', 12", 72, 72', 74, 74' contact blocks
14at, 46at, 72at, 74at, 66a1, 66a7 through-holes
40ai, 42ai, 90ai, 92ai contact terminals
46, 46', 66, 66' contact block accommodating members
48, 78 elastic members
50, 80 positioning pins
60, 62, 94, 96, 98, 100 spacer members

The invention claimed is:
1. A semiconductor device socket comprising:
at least one contact block detachably provided in a contact block accommodation portion formed around a semiconductor device accommodation portion to place a semiconductor device, the contact block having a plurality of thin-plate contact terminals each having a contact portion to be electrically connected to a terminal of the semiconductor device; and
position adjusting means for adjusting relative positions of the contact portions of the plurality of contact terminals held by the at least one contact block with respect to the terminals of the semiconductor device placed at the semiconductor device accommodation portion, and
wherein the position adjusting means includes:
a first through-hole row comprising a plurality of through-holes provided in the contact block at predetermined equal intervals in a position adjustment direction;
a second through-hole row comprising a plurality of through-holes provided in the contact block accommodation portion at different intervals in the position adjustment direction, corresponding to the through-holes of the first through-hole row; and
a positioning pin inserted to both of a through-hole selected from the first through-hole row and to a through-hole selected from the second through-hole row thereby to position the contact block with respect to the contact block accommodation portion.

* * * * *